US011163022B2

(12) United States Patent
Daubert

(10) Patent No.: US 11,163,022 B2
(45) Date of Patent: Nov. 2, 2021

(54) MAGNETIC FIELD SENSOR FOR ANGLE DETECTION WITH A PHASE-LOCKED LOOP

(71) Applicant: Allegro MicroSystems, LLC, Manchester, NH (US)

(72) Inventor: Steven Daubert, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 113 days.

(21) Appl. No.: 14/737,739

(22) Filed: Jun. 12, 2015

(65) Prior Publication Data
US 2016/0363638 A1 Dec. 15, 2016

(51) Int. Cl.
| G01R 33/07 | (2006.01) |
|---|---|
| G01R 33/00 | (2006.01) |
| G01R 33/09 | (2006.01) |
| G01D 5/14 | (2006.01) |

(52) U.S. Cl.
CPC ........... *G01R 33/077* (2013.01); *G01D 5/145* (2013.01); *G01R 33/0041* (2013.01); *G01R 33/075* (2013.01); *G01R 33/093* (2013.01); *G01R 33/096* (2013.01); *G01R 33/098* (2013.01)

(58) Field of Classification Search
CPC ............ G01R 33/0023; G01R 33/0029; G01R 33/0035; G01R 33/0041; G01R 33/06; G01R 33/07; G01R 33/072; G01R 33/075; G01R 33/077; G01R 33/09; G01R 33/091; G01R 33/093; G01R 33/095; G01R 33/096; G01R 33/098; G01B 7/14; G01B 7/30; G01D 5/142; G01D 5/145; G01D 5/147
See application file for complete search history.

(56) References Cited

U.S. PATENT DOCUMENTS

| 4,327,416 A | 4/1982 | Jerrim |
|---|---|---|
| 4,668,914 A | 5/1987 | Kersten et al. |
| 4,725,957 A | 2/1988 | Alberter et al. |
| 4,761,569 A | 8/1988 | Higgs |
| 4,829,352 A | 5/1989 | Popovic et al. |
| 5,331,218 A | 7/1994 | Moody et al. |
| 5,541,506 A | 7/1996 | Kawakita et al. |
| 5,572,058 A | 11/1996 | Biard |

(Continued)

FOREIGN PATENT DOCUMENTS

| DE | 10 2005 014 509 B4 | 10/2006 |
|---|---|---|
| DE | 10 2005 024 879 A1 | 12/2006 |

(Continued)

OTHER PUBLICATIONS

Rohde, Microwave and Wireless Synthesizers: Theory and Design, pp. 153-155, published by John Wilely and Sons, 1997.*

(Continued)

Primary Examiner — David M Schindler
(74) Attorney, Agent, or Firm — Daly, Crowley, Mofford & Durkee, LLP

(57) ABSTRACT

A magnetic field sensor includes a phase-locked loop to receive a measured magnetic field signal formed from sensing element output signals of a plurality of magnetic field sensing elements in response to a magnetic field. The phase-locked loop is configured to generate an angle signal having a value indicative of the angle of the magnetic field. Associated methods are also described.

35 Claims, 17 Drawing Sheets

(56) References Cited

U.S. PATENT DOCUMENTS

| | | |
|---|---|---|
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |
| 6,236,199 B1 | 5/2001 | Irle et al. |
| 6,261,247 B1* | 7/2001 | Ishikawa ............... A61B 5/0031 33/700 |
| 6,265,864 B1 | 7/2001 | De Winter et al. |
| 6,288,533 B1 | 9/2001 | Haeberli et al. |
| 6,297,627 B1* | 10/2001 | Towne .................. H03G 3/001 324/207.12 |
| 6,356,741 B1 | 3/2002 | Bilotti et al. |
| 6,374,190 B2 | 4/2002 | Schupfner |
| 6,496,784 B1 | 12/2002 | Dukart et al. |
| 6,525,531 B2 | 2/2003 | Forrest et al. |
| 6,542,068 B1 | 4/2003 | Drapp et al. |
| 6,545,462 B2 | 4/2003 | Schott et al. |
| 6,622,012 B2 | 9/2003 | Bilotti et al. |
| 6,686,733 B2 | 2/2004 | Muth |
| 6,768,301 B1 | 7/2004 | Hohe et al. |
| 6,969,988 B2 | 11/2005 | Kakuta et al. |
| 7,030,606 B2 | 4/2006 | Kato et al. |
| 7,038,448 B2 | 5/2006 | Schott et al. |
| 7,085,119 B2 | 8/2006 | Bilotti et al. |
| 7,119,538 B2 | 10/2006 | Blossfeld |
| 7,159,556 B2 | 1/2007 | Yoshihara |
| 7,235,968 B2 | 6/2007 | Popovic et al. |
| 7,259,556 B2 | 8/2007 | Popovic et al. |
| 7,301,353 B2* | 11/2007 | Ausserlechner ......... G01D 3/02 324/207.2 |
| 7,307,824 B2 | 12/2007 | Bilotti et al. |
| 7,362,094 B2 | 4/2008 | Voisine et al. |
| 7,714,570 B2 | 5/2010 | Thomas et al. |
| 7,746,065 B2 | 6/2010 | Pastre et al. |
| 7,759,929 B2 | 7/2010 | Forsyth |
| 7,872,322 B2 | 1/2011 | Schott et al. |
| 7,911,203 B2 | 3/2011 | Thomas et al. |
| 7,965,076 B2 | 6/2011 | Schott |
| 7,990,209 B2 | 8/2011 | Romero |
| 7,994,774 B2 | 8/2011 | Thomas et al. |
| 8,350,563 B2 | 1/2013 | Haas et al. |
| 8,416,014 B2 | 4/2013 | Romero |
| 8,749,005 B1 | 6/2014 | Foletto et al. |
| 8,922,206 B2 | 12/2014 | Friedrich et al. |
| 2003/0042894 A1 | 3/2003 | Waffenschmidt |
| 2003/0057941 A1 | 3/2003 | Collier-Hallman et al. |
| 2003/0155912 A1 | 8/2003 | Motz |
| 2005/0278137 A1 | 12/2005 | Hammerschmidt et al. |
| 2006/0011999 A1 | 1/2006 | Schott et al. |
| 2006/0265085 A1* | 11/2006 | Chen ................... G05B 13/024 700/41 |
| 2006/0290545 A1 | 12/2006 | Granig et al. |
| 2007/0029998 A1 | 2/2007 | Popovic et al. |
| 2007/0084636 A1* | 4/2007 | Royle ..................... G01V 3/08 175/45 |
| 2008/0030187 A1* | 2/2008 | Nguyen Phuoc ....... H02P 1/029 324/160 |
| 2008/0246471 A1* | 10/2008 | Kahlman ............... B82Y 25/00 324/234 |
| 2009/0121707 A1 | 5/2009 | Schott |
| 2009/0174395 A1 | 7/2009 | Thomas et al. |
| 2010/0028287 A1 | 2/2010 | Muthers |
| 2010/0030427 A1 | 2/2010 | Mitsuhara et al. |
| 2010/0156397 A1 | 6/2010 | Yabusaki et al. |
| 2010/0164491 A1 | 7/2010 | Kejik et al. |
| 2011/0248708 A1 | 10/2011 | Thomas et al. |
| 2012/0086442 A1 | 4/2012 | Haas et al. |
| 2012/0095712 A1 | 4/2012 | Komasaki et al. |
| 2012/0158335 A1 | 6/2012 | Donovan et al. |
| 2012/0212215 A1* | 8/2012 | Veijanen ................. H02P 21/18 324/207.22 |
| 2012/0262155 A1 | 10/2012 | Donovan et al. |
| 2012/0286773 A1 | 11/2012 | Reymond et al. |
| 2012/0313635 A1 | 12/2012 | Daubert |
| 2013/0265031 A1 | 10/2013 | Friedrich et al. |
| 2013/0265037 A1 | 10/2013 | Friedrich et al. |
| 2013/0335069 A1 | 12/2013 | Vig et al. |
| 2014/0003464 A1 | 1/2014 | Ausserlechner et al. |
| 2014/0114535 A1* | 4/2014 | Ohmae .................. B62D 5/091 701/42 |
| 2014/0225597 A1 | 8/2014 | Romero et al. |
| 2015/0022188 A1* | 1/2015 | Daubert ............... G01R 33/077 324/207.12 |
| 2015/0061656 A1 | 3/2015 | Fernandez et al. |
| 2015/0176963 A1 | 6/2015 | Diaconu et al. |
| 2015/0176964 A1 | 6/2015 | Uberti et al. |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 1 679 524 A1 | 7/2006 |
| EP | 10 2006 037 226 A1 | 2/2008 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2008286695 A | 11/2008 |
| JP | 2010-014607 | 1/2010 |
| JP | 2010-078366 | 4/2010 |
| WO | WO 98/02721 | 1/1998 |
| WO | WO 1998/010302 | 3/1998 |
| WO | WO 1998/054547 | 12/1998 |
| WO | WO 2000/002266 | 1/2000 |
| WO | WO 2003/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2008/145662 A1 | 12/2008 |
| WO | WO 2009/124969 A1 | 10/2009 |
| WO | WO 2014/126670 A1 | 8/2014 |

OTHER PUBLICATIONS

Allegro Microsystems, Inc.; "High Precision Linear Hall Effect Sensor IC with a Push/Pull, Pulse Width Modulated Output;" A1351; pp. 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmabie Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No, 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik,.et al.; "Ultra Low-Power Angular Position Sensor for High Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

(56) References Cited

OTHER PUBLICATIONS

Melexis Microelectronic Integrated Systems; MLX90333; "Traxis 3D-Joystick Position Sensor;" Data Sheet; Mar. 2009; 43 pages.
Memsic Corporation; AN-00MM-004; "Electronic Tilt Compensation;" Mar. 2008: 5 pages.
Memsic Corporation; AN-00MM-003; "Magnetic Sensor Calibration;" Mar. 2008; 5 pages.
Memsic Corporation; AN-00MM-002; "Magnetometer Soldering Methodology;" Jun. 2008; 2 pages.
Memsic Corporation; AN-00MM-001; "Magnetometer Fundamentals;" Jun. 2008; 6 pages.
Memsic Corporation; AN-00MN3-005; "Magnetic Sensor Placement Guidelines;" Oct. 2008; 2 pages.
Memsic Corporation; MMC312xMQ; "Tri-axis Magnetic Sensor, with I$^2$C Interface;" Aug. 14, 2008; 9 pages.
Memsic Corporation; MMC314xMS; "Ultra Small 3-axis Magnetic Sensor, with I$^2$C Interface;" Mar. 31, 2010; 8 pages.
Micronas GmbH; "HAL® 3625 Programmable Direct Angle Sensor;" Product Information; Sep. 2009; 2 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23.
Allegro Microsystems, Inc.; "A1360 A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.
Allegro Microsystems, Inc.; "3235 Data Sheet 27633A, Dual-Output Hall Effect Switch;" http:/www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datasheet; 10-Bit Programmable Magnetic Rotary Encoder;" Revision 1.1; Jan. 2004; pp. 1-20.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; "Allegro Microsystems, Inc.; AN290061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices In the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
Sensima technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrelia/Azionamenti%20Elettrici%20II/Sensori%20e%20trasduttori/Data%20Sheet%20~%202SA-10.pdf; pp. 1-7.
Van der Meer; et al.; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Banjevic; "High Bandwidth CMOS Magnetic Sensors Based on the Miniaturized Circular Vertical Hall Device;" Sep. 2011; 153 pages.
Drljaca, et al.; "Nonlinear Effects In Magnetic Angular Position Sensor With Integrated Flux Concentrator;" 23$^{rd}$ International Conference on Microelectronics (MIEL 2002); vol. 1; NIS; Yugoslavia; May 12-15, 2002; pp. 223-228.

(56) References Cited

OTHER PUBLICATIONS

Melexis MLX 90324; ""Under-the-Hood" Triaxis Rotary Position feat. SENT Protocol;" 3901090324 Data Sheet; Dec. 2008; 40 pages.
Petrie; "Circular Vertical Hall Magnetic Field Sensing Element and Method with a Plurality of Continuous Output Signals;" U.S. Appl. No. 13/035,243, filed Feb. 25, 2011; 56 pages.
U.S. Appl. No. 14/138,840, filed Dec. 23, 2013, Diaconu et al.
U.S. Appl. No. 14/138,851, filed Dec. 23, 2013, Uberti et al.
Allegro Microsystems, LLC.A1332 Datasheet; "Precision Hall Effect Angle Sensor IC with $I^2$ C Interface;" Dec. 4, 2014; 19 pages.
PCT Search Report and Written Opinion of the ISA dated Jun. 24, 2014; for PCT Pat. App. No. PCT/US2014/011580; 13 pages.
PCT Search Report and Written Opinion of the ISA dated Jun. 4, 2015; for PCT Pat. App. No. PCT/US2014/011579; 15 pages.
PCT Search Report and Written Opinion of ISA dated Feb. 18, 2015; for PCT Pat. App. No. PCT/US2014/069729; 19 pages.
PCT Search Report and Written Opinion of the ISA dated Sep. 8, 2014 for PCT Pat. App. No. PCT/US2014/043770; 14 pages.
Intention to Grant with allowed specification dated Dec. 9, 2016 for European Application No. 14738710.4; 60 pages.
Response to Written Opinion filed Aug. 5, 2016 for European Application No. 14738710.4; 15 pages.
Article 19 Amendment filed Sep. 8, 2016 for PCT Application No. PCT/US2016/034931; 16 pages.
Office Action dated Jan. 13, 2016 for U.S. Appl. No. 13/947,608; 11 pages.
Response to Office Action filed Mar. 4, 2016 for U.S. Appl. No. 13/947,608; 9 pages.
Notice of Allowance dated May 6, 2016 for U.S. Appl. No. 13/947,608; 9 pages.
International Preliminary Report on Patentability dated Feb. 4, 2016 for PCT Application No. PCT/US2014/043770; 11 pages.
Schurig et al. "CMOS Integrated Vertical Hall Sensor with Low Offset" XVI the $16^{th}$ European Conference on Solid-State Transducers, Sep. 15-18, 2002, 4 pages.
Search Report and Written Opinion dated Aug. 5, 2016 for PCT Application No. PCT/US2016/034931; 18 pages.
Analog Devices; "AD639: Universal Trigonometric Function Converter;" http://www.analog.com/en/obsolete/ad639/products/product.html; Jun. 1985; 13 pages.
Banjevic et al.; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Intersil; "ICL8038 Precision Waveform GeneratorNoltage controlled Oscillator;" http://www.intersil.com/en/productsl other-analog/special-analog/othermiscellaneous/ ICL8038.html; downloaded Jan. 16, 2014; 13 pages.
International Preliminary Report on Patentability dated Dec. 21, 2017 for PCT Application No. PCT/US2016/034931; 14 pages.
Response to Communication dated May 30, 2018 for European Application No. 16730126.6; 20 pages.
European Intention to Grant dated Dec. 12, 2018 for European Application No. 16730126.6, 6 pages.
European 161/162 Communication dated Feb. 24, 2016 for European Application No. 14738710.4; 2 Pages.
European 161/162 Communication dated Feb. 2, 2018 for European Application No. 16730126.6; 3 Pages.
Yuasa and Hara Letter dated May 9, 2019 with Allowance Report and Allowed Claims for JP Pat. Appl. No. 2017-564370; 10 pages.

\* cited by examiner

MAGNETIC FIELD SENSOR FOR ANGLE DETECTION WITH A PHASE-LOCKED LOOP

CROSS REFERENCE TO RELATED APPLICATIONS

Not Applicable.

STATEMENT REGARDING FEDERALLY SPONSORED RESEARCH

Not Applicable.

FIELD

This invention relates generally to magnetic field sensors and, more particularly, to magnetic field sensors that can provide an output signal representative of an angle of a magnetic field.

BACKGROUND

Magnetic field sensing elements can be used in a variety of applications. In one application, a magnetic field sensing element can be used to detect a direction of a magnetic field, i.e., an angle of the direction of the magnetic field.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant and diffusion region in a substrate. The common implant and diffusion region can be a common epi (epitaxial) region (e.g., layer) upon a substrate, bounded by semiconductor isolation structures. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements. Collectively, magnetic field sensing element(s) that generate an output signal related to an angle of a magnetic field are referred to herein "angle sensing elements."

More parameters can characterize the performance of angle sensing element(s), e.g., a CVH sensing element. One such parameter is an angular accuracy of the output signal generated by the angle sensing element(s). Angular accuracy can have both an average angle error that is the same at all magnetic field pointing angles, and also an angle error that is different at different magnetic field angles (i.e. a non-linearity error). Another parameter is the speed with which the angle sensing element(s) can convey the angle of the magnetic field; a parameter sometimes referred to as the angle refresh rate. It will be understood that the speed is particularly important for applications in which the angle of the magnetic field may be rapidly changing. Some parameters that can characterize an angle sensing element tend to change with temperature.

SUMMARY

The present disclosure provides circuits and techniques that can process output signals from an angle sensing element quickly to achieve a high angle refresh rate. In accordance with one aspect, a magnetic field sensor includes a plurality of magnetic field sensing elements, each configured to generate a respective magnetic field sensing element output signal responsive to a magnetic field, wherein the magnetic field sensing element output signals form a measured magnetic field signal having a phase indicative of an angle of the magnetic field. A phase-locked loop coupled to receive the measured magnetic field signal is configured to generate an angle signal having a value indicative of the angle of the magnetic field.

Features may include one or more of the following. The measured magnetic field signal has a frequency and the phase-locked loop may be responsive to a clock signal having a frequency related to the frequency of the magnetic field signal. The phase-locked loop may comprise a phase detector having a first input responsive to the measured magnetic field signal and a second input responsive to a feedback signal having a respective phase and may be configured to compare the phase of the measured magnetic field signal and the phase of the feedback signal and to generate a difference signal indicative of a difference between the phase of the measured magnetic field signal and the phase of the feedback signal. The phase detector may further comprise an oscillator responsive to the angle signal to generate the feedback signal with a phase that minimizes the difference signal. The oscillator may comprise a phase increment accumulator responsive to the clock signal to generate a phase accumulated signal, a summation element responsive to the phase accumulated signal and to the angle signal to generate a summed signal, and a look-up table configured to provide a sine value in response to the summed signal.

The phase-locked loop may further comprise a proportional-integral controller coupled to receive the difference signal and configured to provide the angle signal. The proportional-integral control may comprise at least one gain element configured to perform a shift function. The phase detector may comprise an automatic gain control circuit coupled to receive the measured magnetic field signal and configure to provide a unity gain signal having a phase indicative of the angle of the magnetic field, a multiplier responsive to the unity gain signal and to the feedback signal to provide a product signal, and a low pass filter responsive to the product signal to provide the difference signal. In an embodiment, the measured magnetic field signal has a frequency and the low pass filter comprises one or more notches at one or more respective frequencies related to the frequency of the measured magnetic field signal. The plurality of magnetic field sensing elements may comprise a respective plurality of vertical Hall Effect elements arranged as a circular vertical Hall (CVH) element. The sensor may further comprise a high pass filter responsive to the plurality of magnetic field sensing element output signals to generate the measured magnetic field signal and/or an angle error correction circuit responsive to the angle signal and to the measured magnetic field signal to generate a corrected angle value. The measured magnetic field signal may be substantially sinusoidal or square-wave shaped. The magnetic field may be a diagnostic magnetic field, as may be provided for self-test purposes. The angle signal may have a substantially constant refresh rate.

In accordance with another aspect, a method of detecting an angle of a magnetic field with a magnetic field sensor comprising a plurality of magnetic field sensing elements, each configured to generate a respective magnetic field sensing element output signal responsive to a magnetic field, wherein the magnetic field sensing element output signals form a measured magnetic field signal having a phase indicative of an angle of the magnetic field, comprises adjusting a gain of the measured magnetic field signal to generate a gain-adjusted signal, comparing the phase of the gain-adjusted signal to the phase of a feedback signal to provide a difference signal proportional to the phase difference, processing the difference signal with a controller to provide an angle signal having a value proportional to the angle of the magnetic field, and using the angle signal to generate the feedback signal having a phase that minimizes the difference signal.

Features may include one or more of the following. The measured magnetic field signal has a frequency and using the angle signal to generate the feedback signal may comprise providing an oscillator having a first input responsive to the angle signal and a second input responsive to a clock signal having a frequency related to the frequency of the measured magnetic field signal. Providing the oscillator may comprise providing a phase increment accumulator responsive to the clock signal to generate a phase accumulated signal, subtracting the angle signal from the phase accumulated signal to generate a summed signal, and looking up a sine value in a look-up table in response to the summed signal. Comparing the phase of the gain-adjusted signal to the phase of the feedback signal to provide the difference signal may comprise multiplying the gain-adjusted signal and the feedback signal to provide a product signal and filtering the product signal to provide the difference signal. Filtering the product signal may comprise low pass filtering the product signal with a filter having a notch at a frequency related to a frequency of the measured magnetic field signal. Processing the difference signal with a controller to provide the angle signal may comprise coupling the difference signal to a proportional-integral controller and/or performing a shift function to establish a gain of the controller.

Detecting an angle of a magnetic field with a magnetic field sensor may comprise detecting the angle of the magnetic field in a magnetic field sensor comprising a plurality of magnetic field sensing elements, each comprising a respective plurality of vertical Hall Effect elements arranged as a circular vertical Hall (CVH) element. The method may further comprise filtering the plurality of magnetic field sensing element output signals with a high pass filter to generate the measured magnetic field signal. The magnetic field sensing element output signals may form a substantially sinusoidal measured magnetic field signal or a substantially square-wave measured magnetic field signal. The magnetic field may be a diagnostic magnetic field, as may be provided for self-test purposes. Processing the difference signal with a controller to provide the angle signal may include processing the difference signal to provide the angle signal at a substantially constant rate.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
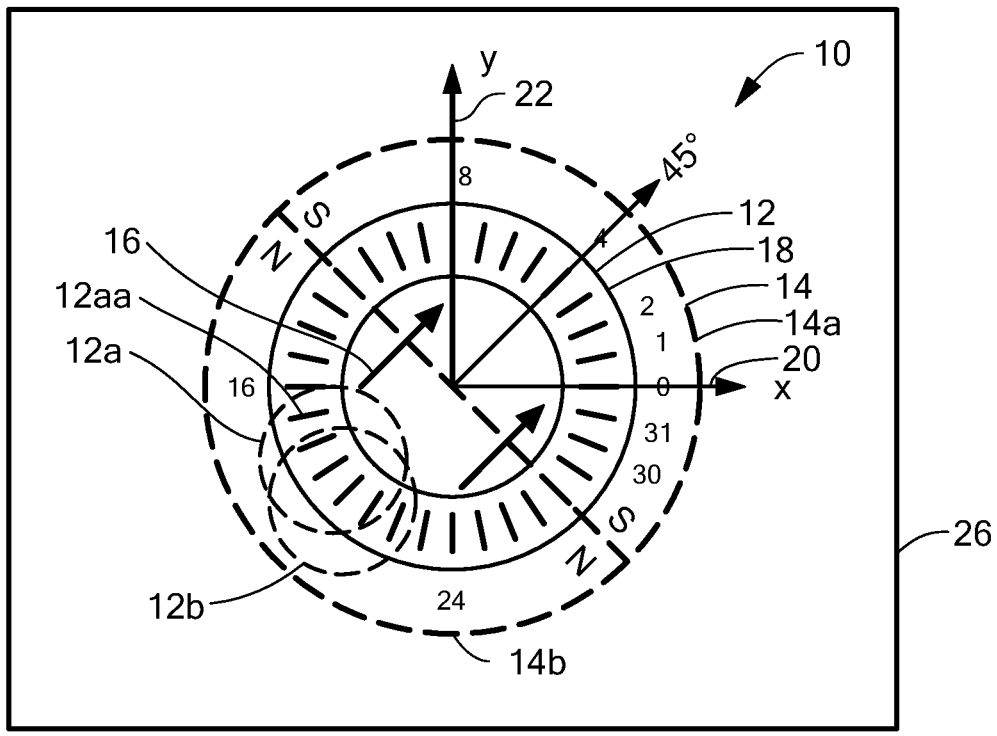
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a circular vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a compound, e.g., type III-V, semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

While a circular vertical Hall (CVH) element, which has a plurality of vertical Hall elements, is described in examples below, it should be appreciated that the same or similar techniques and circuits apply to any type of magnetic field sensing element(s) arranged in a manner to detect an angle of a pointing direction of a magnetic field, e.g., a rotation angle of a target object to which a magnet is attached.

Referring to FIG. 1, a circular vertical Hall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can be positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft or an automobile camshaft, and is subject to rotation relative to the CVH sensing element 12. With this arrangement, the CVH sensing element 12, in combination with an electronic circuit described below, can generate a signal related to the angle of rotation of the magnet 14, i.e., an angle of rotation of the target object to which the magnet is coupled.

In some applications, the magnetic field 16 may be a diagnostic magnetic field generated for self-test purposes in order to test all or portions of a magnetic field sensor associated with the sensing element 12. In one such example, a current source (e.g., current sources 103 of FIG. 3) may be provided with which a current can be injected into the CVH sensing element 12 in order to generate the diagnostic magnetic field.

Figure 1A:
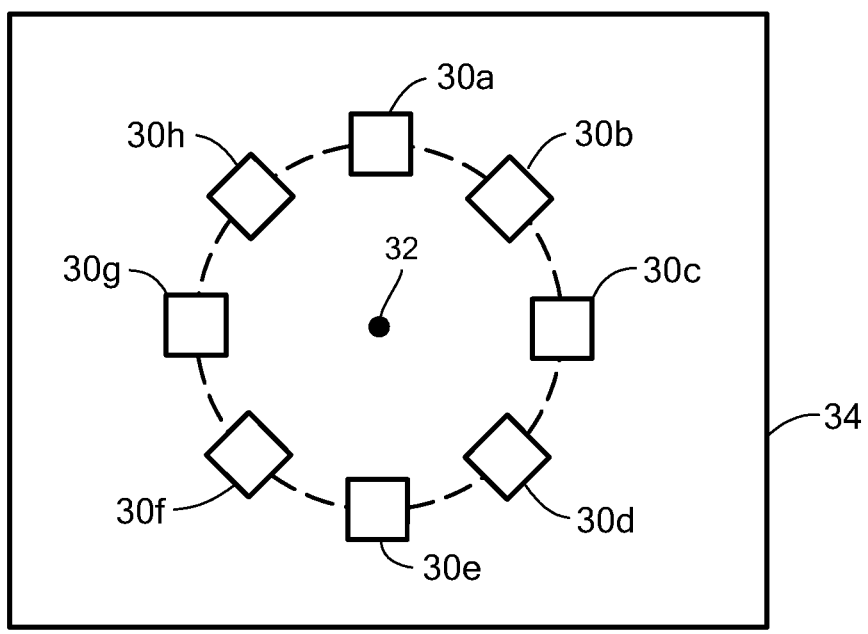
FIG. 1A is pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having an axis of maximum response parallel to a surface of a substrate 34. As further alternatives, a Circular Planar Hall (CPH) configuration as described in a U.S. Pat. No. 8,922,206 can be used or polygonal shaped vertical Hall elements as described in U.S. Pat. No. 8,749,005 can be used, both of these U.S. patents being assigned to the Assignee of the subject disclosure and incorporated by reference herein in their entirety. These magnetic field sensing elements can be coupled to an electronic circuit the same as or similar to electronic circuits described below. There can also be a magnet the same as or similar to the magnet 14 of FIG. 1 disposed proximate to the magnetic field sensing elements 30a-30h.

Figure 2:
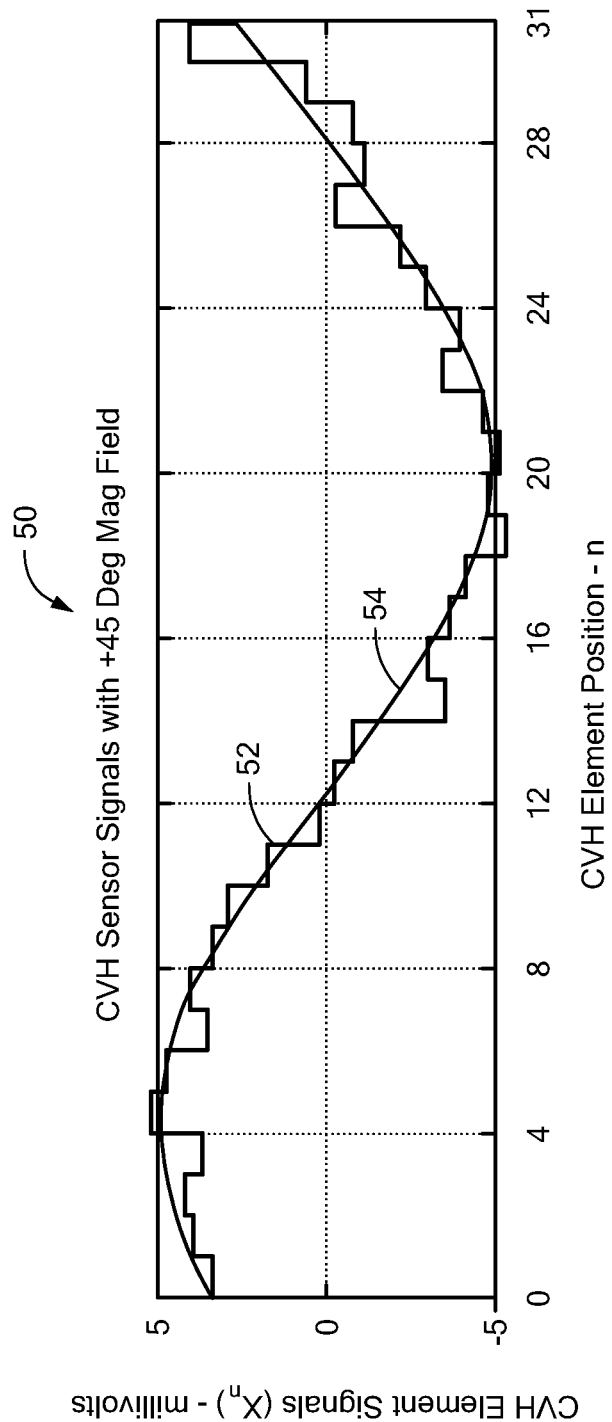
FIG. 2 is a graph showing an output signal as may be generated by the CVH sensing element of FIG. 1 or by the plurality of magnetic field sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 of FIG. 1 pointing at positive forty-five degrees, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show ideal behavior of the signal 52. The signal 52 has variations due to vertical Hall element offsets, which tend to cause corresponding variations of output signals causing them to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-referenced PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 52 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 52 when current spinning is not used. However, for embodiments in which current spinning is used, each step of the signal 52 can be comprised of several sub-steps (not shown, e.g., four sub-steps), each sub-step indicative of a current spinning "phase."

Current spinning and current spinning phases are described more fully below in conjunction with FIGS. 4-4C.

It will be understood that a phase of the signal 52 is related to an angle of the magnetic field 16 of FIG. 1 relative to position zero of the CVH sensing element 12. It will also be understood that a peak amplitude of the signal 52 is generally representative of a strength of the magnetic field 16. Using electronic circuit techniques described in PCT Patent Application No. PCT/EP2008/056517, or using other techniques described below, a phase of the signal 52 (e.g., a phase of the signal 54) can be found and can be used to identify the pointing direction of the magnetic field 16 of FIG. 1 relative to the CVH sensing element 12.

Figure 3:
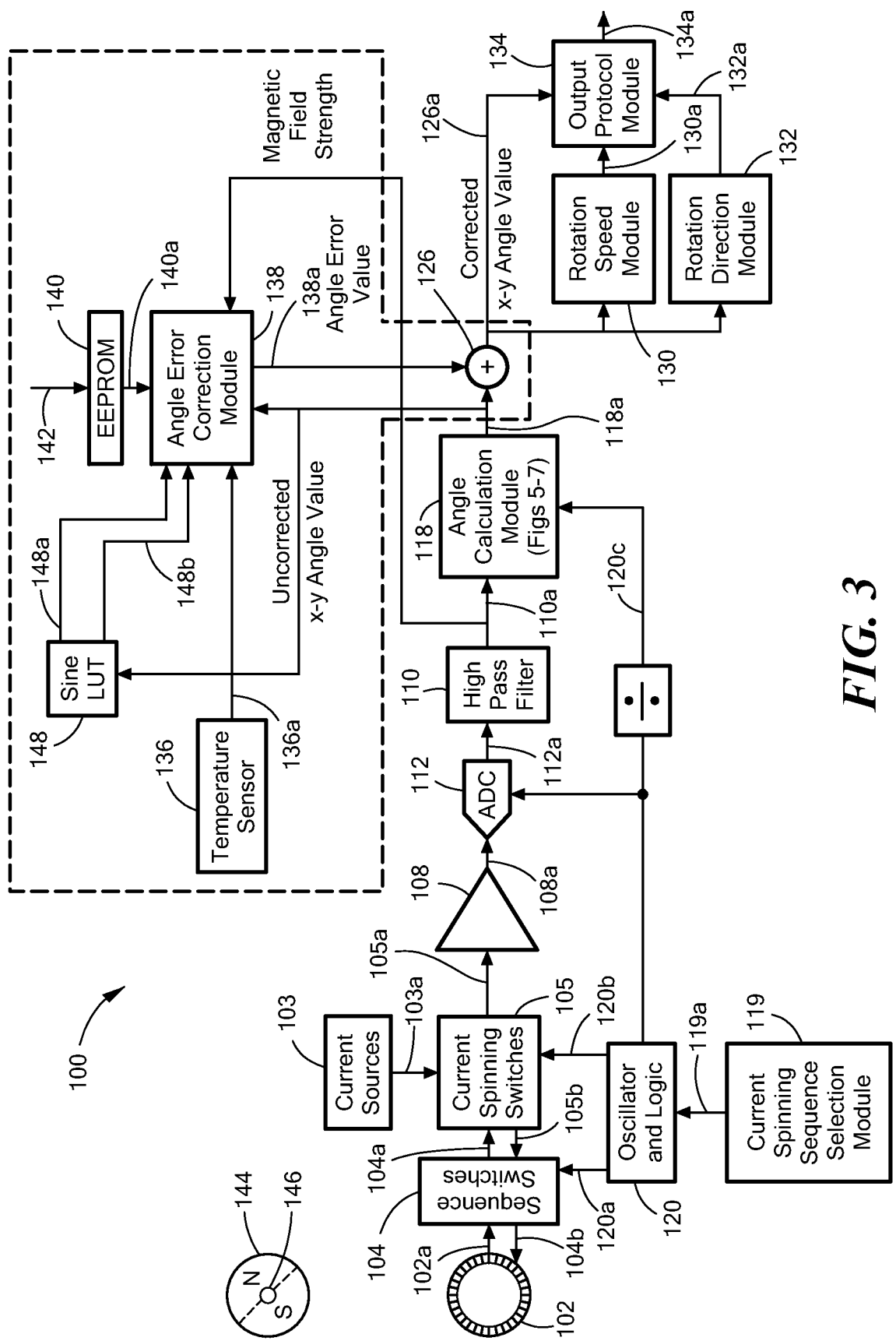
FIG. 3 is a block diagram of an example magnetic field sensor having a CVH sensing element, a current spinning sequence selection module, an angle calculation module including a PLL, and an angle error correction module.

Referring now to FIG. 3, a magnetic field sensor 100 includes a CVH sensing element 102 having a plurality of vertical Hall elements, each vertical Hall element comprising a group of vertical Hall element contacts (e.g., five vertical Hall element contacts). In some embodiments, the CVH sensing element 102 can be the same as or similar to the CVH sensing element 12 described above in conjunction with FIG. 1, and can be disposed proximate to a two pole magnet 144 coupled to a target object 146, which magnet 144 can be the same as or similar to the magnet 14 of FIG. 1. However, in some embodiments, the CVH sensing element 102 can be replaced by a group of magnetic field sensing elements the same as or similar to those described above in conjunction with FIG. 1A.

The CVH sensing element 102 can be coupled to sequence switches 104 that sequence through the vertical Hall elements of the CVH sensing element 102 to provide an output signal 104a, which can be the same as or similar to the sequenced signal 52 of FIG. 2.

The CVH sensing element 102 can also be coupled to current spinning switches 105, which can be coupled to the CVH sensing element 102 via the sequence switches 104.

Current sources 103 can be configured to generate one or more current signals 103a. The current spinning switches 105 can be coupled to receive the one or more current signals 103a and to provide the current signals as signals 104b to the selected vertical Hall elements within the CVH sensing element 102.

As described above, current spinning, also referred to as chopping, is a process by which current sources, e.g., current sources 103, are sequentially coupled to different selected nodes of a selected vertical Hall element (selected via the sequence switches 104) within the CVH sensing element 102 using the current spinning switches 105. At the same time, and synchronously, the current spinning switches 105 provide couplings to selected output nodes of the selected vertical Hall element in accordance with so-called current spinning phase. Current spinning is further described below in conjunction with FIGS. 4-4C.

A current spinning sequence selection module 119 can generate a current spinning sequence control signal 119a received by an oscillator and logic module 120. The oscillator and logic module 120 can be coupled to provide a control signal 120b, which may take the form of a clock signal, to the current spinning switches 105 to control current spinning phase sequences of selected ones of the vertical Hall elements of the CVH sensing element 102. The oscillator and logic 120 can also be coupled to provide a control signal 120a, which may take the form of a clock signal, to the sequence switches 104, to provide sequential selections of the vertical Hall elements within the CVH sensing element 102 and to provide the sequential output signal 104a from the vertical Hall elements of the CVH sensing element 102 in accordance with the selection.

In some embodiments, current spinning is not used.

An amplifier 108 can be coupled to receive the signal 105a and configured to generate an amplified signal 108a. An analog-to-digital converter 112 can be coupled to receive the amplified signal 108a and configured to generate a converted signal 112a, a digital signal. A high pass filter 110 can be coupled to receive the converted signal 112a and configured to generate a filtered signal 110a. The filtered signal 110a is indicative of the measured magnetic field strength, B, and may be referred to as the measured magnetic field signal 110a.

An angle calculation module 118 can be coupled to receive the filtered signal 110a and configured to generate an uncorrected x-y angle value, $\theta$, 118a indicative of the angle of the magnetic field generated by the magnet 144, but with angle error more fully described below. The angle calculation module 118 can also be coupled to receive a clock signal 120c that may have a frequency related to a frequency of a signal from the oscillator and logic module 120. The angle calculation module 118 is described more fully below.

In operation, the angle signal 118a (alternatively the uncorrected x-y angle value) can have a first angle error. The first angle error is described more fully below in conjunction with FIG. 9. Let it suffice here to say that the first angle error is an angle error that causes the uncorrected x-y angle value 118a to not be perfectly representative of the true angle of the magnetic field generated by the magnet 144.

An angle error correction circuit 137 including an angle error correction module 138 is coupled to receive the uncorrected x-y angle value 118a and the magnetic field signal 110a and configured to generate an angle error value, $\hat{e}$, 138a indicative of the first angle error within the uncorrected x-y angle value 118a. A combining module 126, here shown to be a summing node, can be coupled to receive the uncorrected x-y angle value 118a, coupled to receive the angle error value 138a, and configured to generate a corrected x-y angle value 126a. The corrected x-y angle value 126a can have a second angle error that is smaller than the first angle error of the uncorrected x-y angle value 118a. Thus, the corrected x-y angle value 126a is more accurately representative of the true angle of the magnetic field generated by the magnet 144 and can be an accurate representation of the true angle of the magnetic field where the second angle error component is zero or nearly zero.

The angle correction module 138 can also be coupled to receive a temperature signal 136a generated by a temperature sensor 136. The angle correction module 138 can also be coupled to receive sine values, here shown as two sine values 148a, 148b, from a sine look up table (LUT) 148. In some embodiments, the sine value 148a is representative of a sine value at a fundamental frequency the same as or related to a frequency of the signal 52 of FIG. 2, i.e., a frequency of the signal 104a and the signal 105a. In some embodiments, the sine value 148b is representative of a sine value at a second harmonic of the fundamental frequency. However, the sine look up table 148 can provide any number of sine values representative of any number of harmonics of the fundamental frequency. The sine lookup table 148 can be coupled to receive, and can be indexed in accordance with, the uncorrected x-y angle value 118a or more particularly in accordance with a summation of the uncorrected x-y angle value 118a with phase correction terms $h1p_T, h2p_T$ described below.

The magnetic field sensor 100 can be coupled to receive a control signal 142 from outside of the magnetic field sensor 100. In particular, an electrically erasable programmable read-only memory (EEPROM) can be coupled to receive the control signal 142 having one or more correction coefficients, and can be configured to supply the one or more correction coefficients to the angle correction module 138 as correction coefficients 140a.

The angle correction module 138 is described in greater detail below. However, let it suffice to say here that the angle correction module 138 is responsive to the temperature signal 136a, the magnetic field signal 110a, the uncorrected angle value 118a, and correction coefficients 140a to generate the angle error value 138a.

The magnetic field sensor 100 can also include a rotation speed module 130 and/or a rotation direction module 132, each coupled to receive the corrected x-y angle value 126a. It will be understood that the corrected x-y angle value 126a can change, and therefore, can be representative of a rotating magnetic field when the magnet 144 rotates.

The rotation speed module 130 is configured to generate a rotation speed signal or value 130a indicative of a rotation speed of the magnet. The rotation direction module 132 is configured to generate a direction signal or value 132a indicative of a rotation direction of the magnet 144.

An output protocol module 134 is coupled to receive the corrected x-y angle value 126a, the rotation speed value 130a, and the rotation direction value 132a. The output protocol module 134 is configured to generate an output signal 134a representative of the angle of the magnetic field generated by the magnet 144, representative of the speed of rotation of the magnet 144, and representative of the direction of rotation of the magnet 144. The output signal 134a can be provided in one of a variety of conventional formats, for example, an SPI format, a CAN format, an I$^2$C format, or a Manchester format or motor control output signal formats such as ABI, UVW, or PWM.

Figure 4:
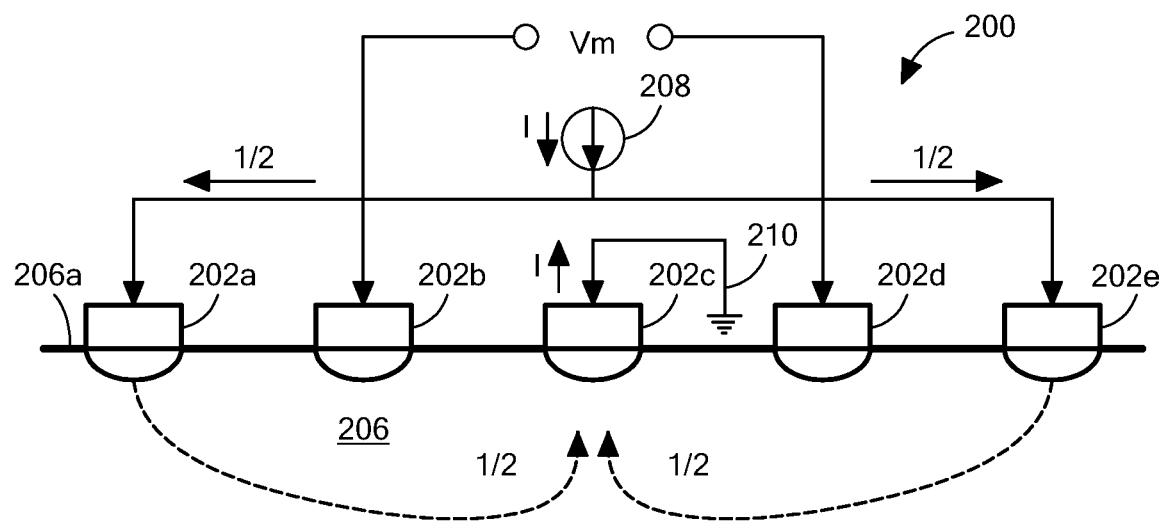
FIGS. 4-4C are block diagrams showing a vertical Hall element of the CVH sensing element of FIG. 3 when coupled into four current spinning phases, each phase associated with operation of one of the vertical Hall elements of the CVH sensing element of FIG. 3.
Figure 4A:
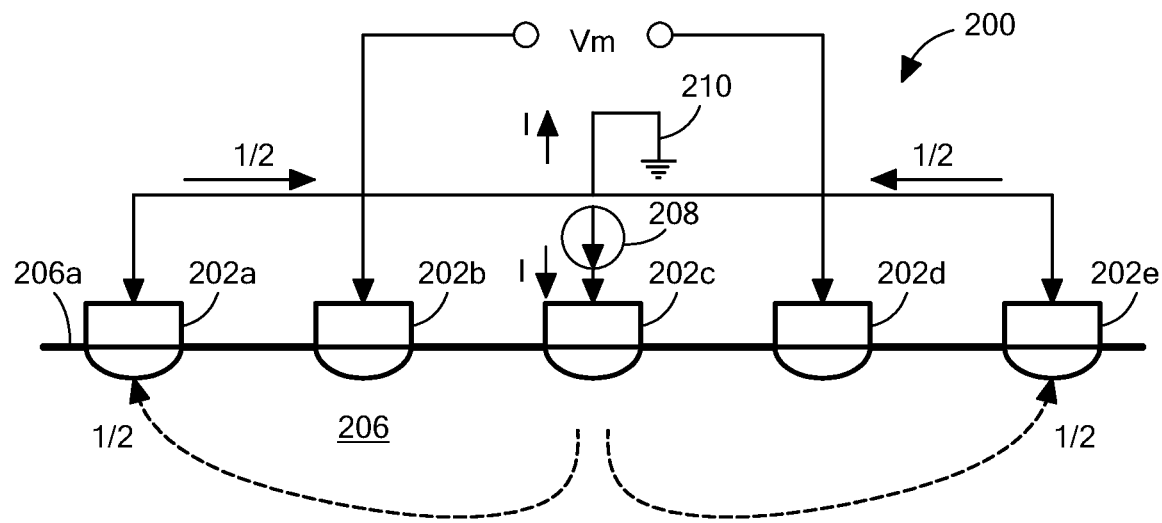
Figure 4B:
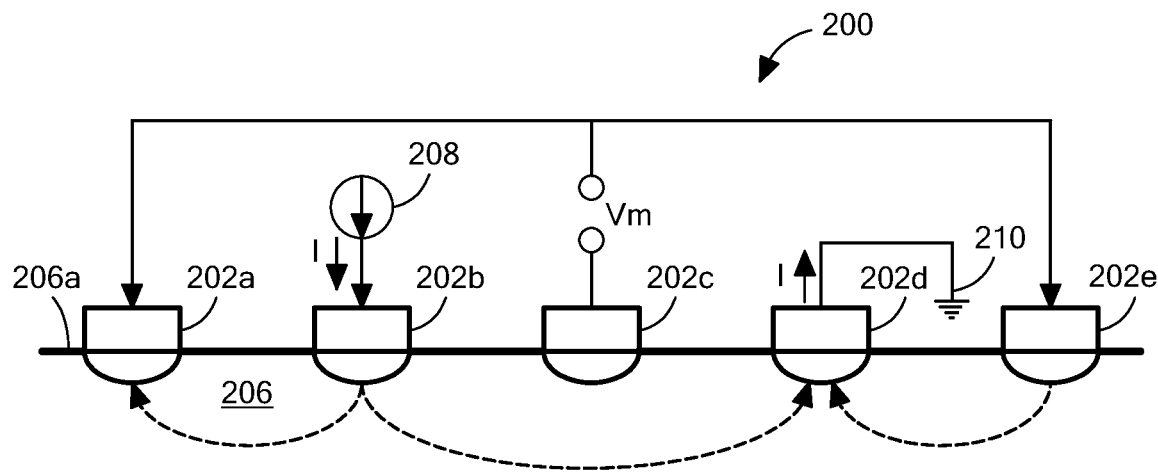
Figure 4C:
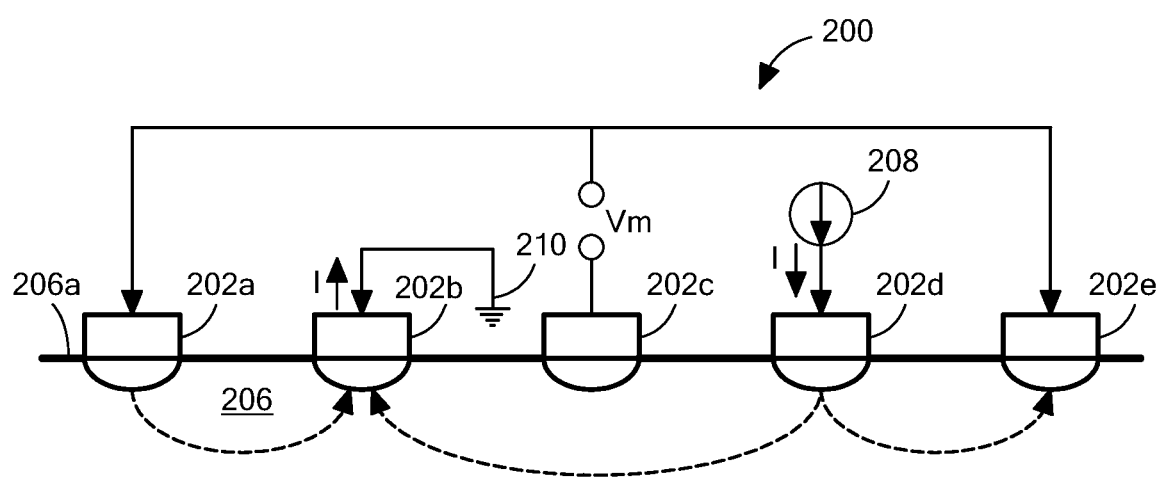

FIGS. 4-4C are representative of a four phase current spinning or chopping that can be used for a vertical Hall element having five contacts. Thus, it should be appreciated that such current spinning can be used for each selected vertical Hall element within the CVH sensing element 12 of FIG. 1 and the CVH sensing element 102 of FIG. 3. It should also be appreciated that such current spinning can also be used for separate magnetic field sensing elements, for example, the magnetic field sensing elements 30a-30h of FIG. 1A, where the magnetic field sensing elements 30a-30h are selected and chopped one at a time.

Referring now to FIG. 4, a vertical Hall element 200 of the CVH sensing element 102 of FIG. 3 is comprised of five vertical Hall element contacts, namely, first, second, third, fourth, and fifth vertical Hall element contacts, 202a, 202b, 202c, 202d, 202e, respectively. In a first chopping or current spinning phase, a current source 208, which can be the same as or similar to the current sources 103 of FIG. 3, can be coupled to the first and fifth vertical Hall element contacts 202a, 202e, respectively, which are coupled together, and can provide a total current of I, with half of the current, I/2, flowing to the first vertical a Hall element contact 202a and half of the current, I/2, flowing to the fifth vertical Hall element contact 202e. The third vertical Hall element contact 202c is coupled to a voltage reference 210, for example, ground. Currents from the current source 208 flow from the first and fifth vertical Hall element contacts 202a, 202e, respectively, through a substrate 206 (e.g., through an epitaxial layer upon a substrate) of the CVH sensing element 200 to the third vertical Hall element contact 202c, as represented by dashed lines.

A signal, Vm, responsive to an external magnetic field, results between the second and fourth vertical Hall element contacts 202b, 202d, respectively. Thus, in the first current spinning phase, the current spinning switches 105 of FIG. 3 can select the second and fourth vertical Hall element contacts 202b, 202d to provide the output signal 105a, and can select the first, fifth, and third vertical Hall element contacts 202a, 202e, 202c, respectively, as those contacts coupled to the current sources 103 of FIG. 3. Couplings during other current spinning phases described below will be apparent.

Referring now to FIG. 4A, in which like elements of FIG. 4 are shown having like reference designations, in a second current spinning phase of the same vertical Hall element 200 (same five vertical Hall element contacts) of the CVH sensing element 102, couplings are changed by the current spinning switches 105 of FIG. 3. In the second phase, the current source 208 is coupled to the third vertical Hall element contact 202c, and the first and fifth vertical Hal element contacts 202a, 202e, respectively, are coupled together and to the reference voltage 210. Thus, the currents flow through the substrate 206 in opposite directions from those shown in FIG. 4.

As in FIG. 4, a signal, Vm, responsive to an external magnetic field, results between the second and fourth vertical Hall element contacts, 202b, 202d, respectively. The signal, Vm, of FIG. 4A is like the signal, Vm, of FIG. 4. However, the offset voltage within the signals can be different, e.g., different in sign.

Referring now to FIG. 4B, in which like elements of FIGS. 4 and 4A are shown having like reference designations, in a third current spinning phase upon the same vertical Hall element 200 (same five vertical Hall element contacts) of the CVH sensing element 102, couplings are again changed by the current spinning switches 105. In the third phase, the current source 208 is coupled to the second vertical Hall element contact 202b, and the fourth vertical Hall element contact 202d is coupled to the reference voltage 210. Thus, a current flows from the second vertical Hall element contact 202b through the substrate 206 to the fourth vertical Hall element contact 202d.

The first and fifth vertical Hall element contacts 202a, 202e, respectively, are coupled together. Some current also flows from the second vertical Hall element contact 202b through the substrate 206 to the first vertical Hall element contact 202a and through the mutual coupling to the fifth vertical Hall element contact 202e. Some current also flows from the fifth vertical Hall element contact 202e through the substrate 206 to the fourth vertical Hall element contact 202d.

A signal, Vm, responsive to an external magnetic field, results between the first vertical Hall element contact 202a first (and the fifth vertical Hall element contact 202e) and the third vertical Hall element contact 202c. The signal, Vm, of FIG. 4B is like the signal, Vm, of FIGS. 4 and 4A. However, the offset voltage within the signal can be different.

Referring now to FIG. 4C, in which like elements of FIGS. 4-4B are shown having like reference designations, in a fourth chopping phase upon the same vertical Hall element 200 (same five vertical Hall element contacts) of the CVH sensing element 102, couplings are again changed by the current spinning switches 105. In the fourth phase, the current is reversed from that shown in FIG. 4B. The current source 208 is coupled to the fourth vertical Hall element contact 202d, and the second vertical Hall element contact 202b is coupled to the reference voltage 210. Thus, a current flows from the fourth vertical Hall element contact 202d through the substrate 206 to the second vertical Hall element contact 202b.

The first and fifth vertical Hall element contacts 202a, 202e, respectively, are coupled together. Some current also flows from the fourth vertical Hall element contact 202d through the substrate 206 to the fifth vertical Hall element contact 202e, through the mutual coupling to the first vertical Hall element contact 202a. Some current also flows from the first vertical Hall element contact 202a through the substrate 206 to the second vertical Hall element contact 202b.

A signal, Vm, responsive to an external magnetic field, results between the first vertical Hall element contact 202a (and the fifth vertical Hall element contact 202e) and the third vertical Hall element contact 202c. The signal, Vm, of FIG. 4C is like the signal, Vm, of FIGS. 4-4B. However, the offset voltage within the signal can be different.

The signals, Vm, provided by the four phases of chopping of FIGS. 4-4C are responsive to an external magnetic field.

As described above, after generating the four current spinning phases on any one vertical Hall element within the CVH sensing element 102, by sequencing operation of the sequence switches 104 of FIG. 3, the current spinning arrangements of FIGS. 4-4C can move to a next vertical Hall element, e.g., five vertical Hall element contacts offset by one vertical Hall element contact from those shown in FIGS. 4-4C, and the four current spinning phases can be performed on the new vertical Hall element by operation of the current spinning switches 105 of FIG. 3.

However, in some embodiments, a sequence of phases (A, B, C, D) represented by the four current spinning phases of FIGS. 4-4C, can be changed in one of a variety of ways. For example, in some embodiments, the sequence of the (A, B, C, D) phases can be randomly selected for each one of the selected vertical Hall elements within the CVH sensing element 102. In some embodiments the random selection is fully random, and in some other embodiments, the random selection is a pseudo-random selection. In some embodiments, the random or pseudo random selection is within each rotation around the CVH sensing element, and in other embodiments, the random or pseudo random selection is among a plurality of rotations around the CVH sensing element.

In some other embodiments, the vertical Hall elements within the CVH sensing element 102 can be partitioned into at least two groups or sets of vertical Hall elements, wherein a first set of the vertical Hall elements uses a first sequence of current spinning phases, e.g., ABCD, and a second set of the vertical Hall elements uses a second different sequence of current spinning phases, e.g., CDAB each time the sequence switches 104 sequence around the CVH sensing element 102. There can be one or more vertical Hall elements within each one of the at least two sets of vertical Hall elements. Other variations of phase sequences are also possible, for example, using different phase sequences for any possible number of sets of vertical Hall elements, for example, three, four, five, or more, including twenty-four respective sets of vertical Hall elements, each time the sequence switches 104 sequence around the CVH sensing element 102.

In some embodiments, the above-described different sets of vertical Hall elements receive the above-described randomly or pseudo randomly selected phase sequences selected within each rotation around the CVH sensing element, and in other embodiments, the random or pseudo random selection is among a plurality of rotations around the CVH sensing element.

Thus, in general, there can be variations in, or differences in, the current spinning phase sequences among the plurality of vertical Hall elements within the CVH sensing element 102.

Figure 5:
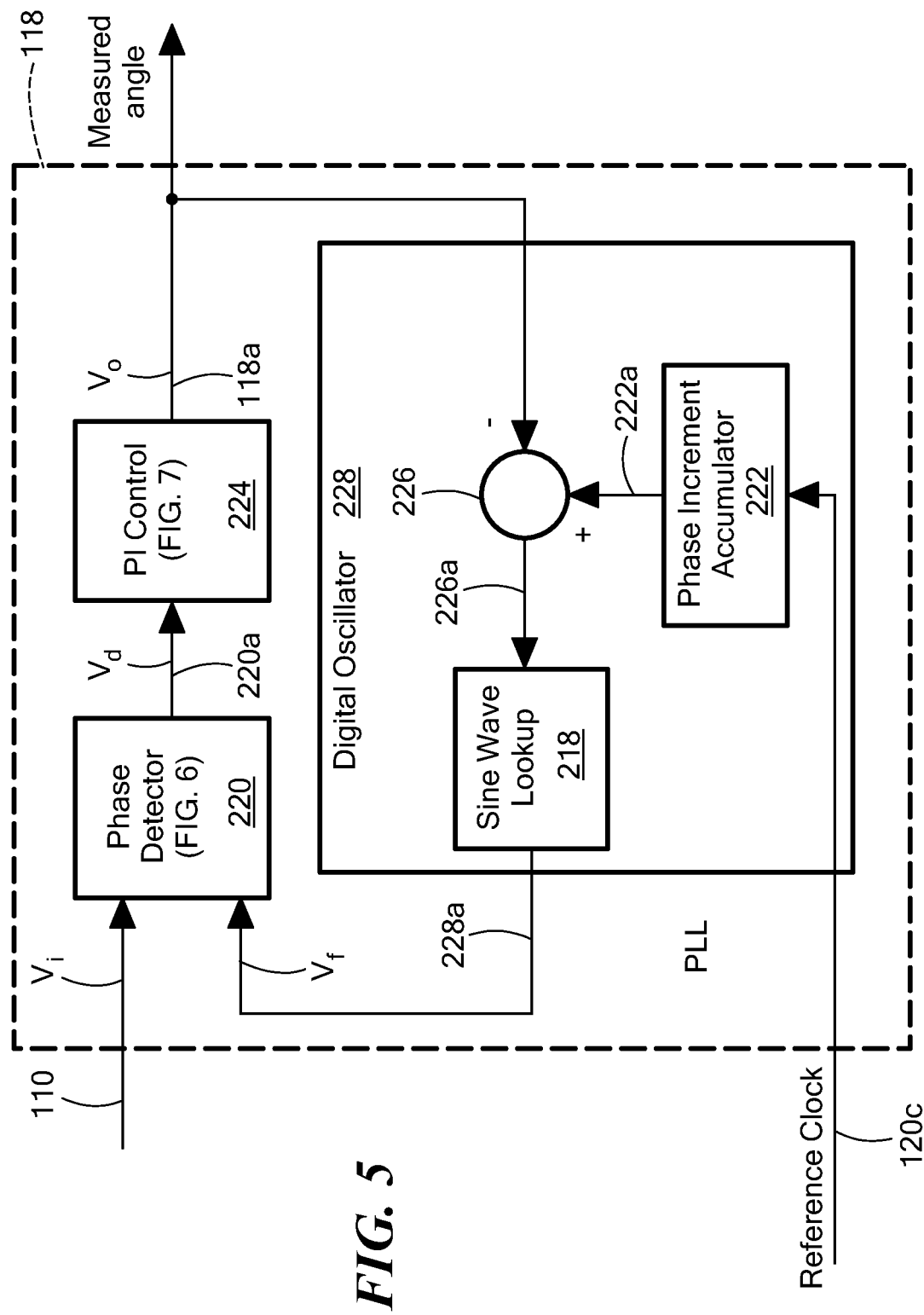
FIG. 5 is a block diagram showing an example angle calculation module having a phase detector, a Proportional-Integral (PI) controller, and an oscillator.

Referring to FIG. 5, an example angle calculation module 118 of the type suitable for use in the sensor 100 of FIG. 3 is provided in the form of a Phase-Locked Loop (PLL) including a phase detector 220, a Proportional-Integral (PI) controller 224, and an oscillator 228. The PLL angle calculation module 118 is configured to receive the signal 110a (FIG. 3), which may be referred to as the measured magnetic field signal and denoted Vi, and to generate an angle signal 118a (FIG. 3), which may be referred to as the uncorrected x-y angle value and denoted Vo. The angle signal 118a has a value proportional to the phase of the measured magnetic field signal 110a and thus, indicative of the angle of the magnetic field. It will be appreciated that the measured magnetic field signal 110a, in some embodiments, will have a sinusoidal, or substantially sinusoidal shape. However, in other embodiments, the measured magnetic field signal may have a substantially square-wave shape.

Figure 6:
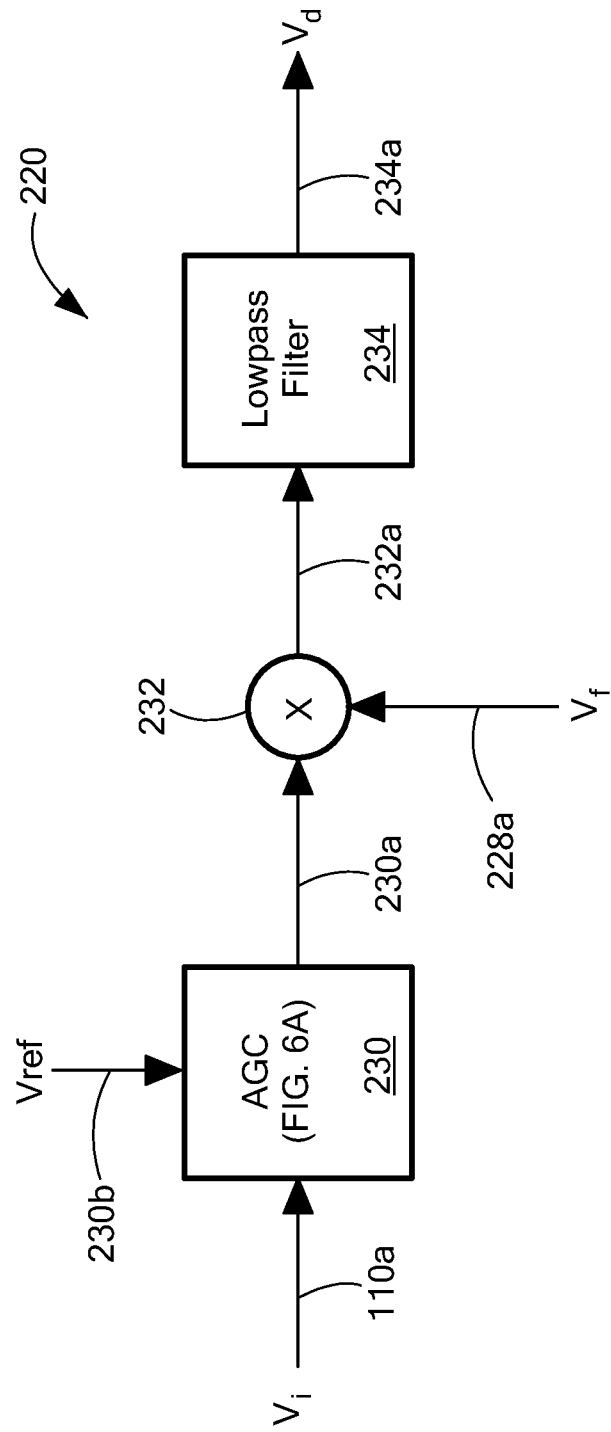
FIG. 6 is a block diagram of an example phase detector of FIG. 5 having an Automatic Gain Control (AGC) circuit.
Figure 6A:
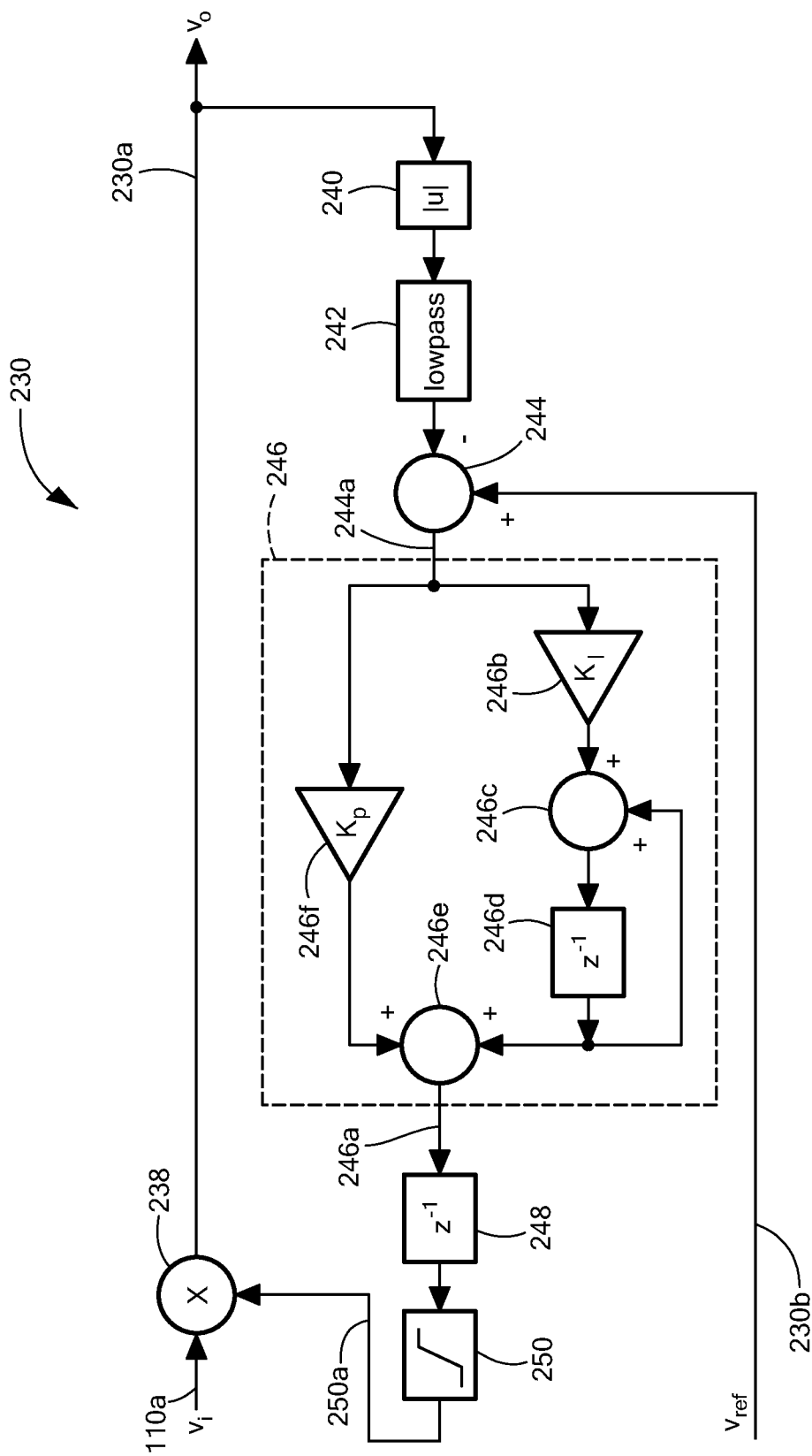
FIG. 6A is a block diagram of an example AGC circuit of FIG. 6.

An example phase detector 220 is shown in FIGS. 6 and 6A and described below. Suffice it to say here that the phase detector 220 has a first input responsive to the measured magnetic field signal 110a and a second input response to a feedback signal 228a and is configured to compare the phase of the measured magnetic field signal 110a to the phase of the feedback signal 228a in order to generate a difference signal 220a, Vd, having a value indicative of the difference between the compared phases.

A controller 224 is coupled to receive the difference signal 220a and is configured to generate the angle signal 118a, as shown. The controller 224 may take various forms suitable for ensuring stability of the closed-loop system. In an embodiment, the controller 224 is a Proportional-Integral (PI) controller. An example PI controller 224 is shown and described in connection with FIG. 7.

The angle signal 118a is coupled to the oscillator 228 and in particular to a control input of the oscillator in order to generate the feedback signal 228a. In general, the feedback signal 228a has a phase that minimizes the difference signal 220a; or in other words, has a phase that is locked to the phase of the measured magnetic field signal 110a. The oscillator 228 is further responsive to a clock signal 120c, as may be provided by divider 111 (FIG. 3) coupled to the oscillator and logic circuit 120, such that the clock signal 120c ensures that the feedback signal 228a has a frequency related to the frequency of the measured magnetic field signal 110a (e.g., the clock signal frequency may be a multiple of the frequency of the measured signal 110a and in particular may be more than twice the frequency of the measured magnetic field signal 110a). With this arrangement, the PLL angle calculation module 118 functions to adjust the phase of the angle signal 118a to match the phase of the measured signal 110a. As a result, the angle signal 118a, which provides the control input to the oscillator, has a value indicative of the phase of the measured magnetic field signal (and thus, indicative of the angle of the magnetic field).

The oscillator 228 may include a phase accumulator 222, a summation element 226, and a sine lookup table 218, as shown. Operation of the oscillator 228 is explained below.

In an embodiment, the PLL 118 may be implemented with digital circuitry and techniques such that the signals may be in the form of sampled data signals. For example, the signals may comprise digital words containing n samples. Typical values for n are 16 or 32. However, it will be appreciated that analog circuitry and techniques may be used to provide portions or the entirety of the PLL 118.

Referring also to FIG. 6, an example phase detector 220 of a type suitable for use in the PLL 118 of FIG. 5 includes an Automatic Gain Control (AGC) circuit 230, a multiplier 232, and a low pass filter 234. An example AGC circuit 230 is shown in FIG. 6A. Suffice it to say here that the AGC circuit 230 adjusts the gain of the measured magnetic field signal 110a in response to a reference signal 230b in order to maintain the AGC output signal 230a at relatively constant peak-to-peak amplitude. As one example, the output signal 230a of the AGC circuit 230 may be a unity gain signal.

The input to the AGC circuit 230 (i.e., the measured magnetic field signal 110a) can be given by:

$$v_i = V_i \sin(\omega_{CVH} t) \qquad (1)$$

Multiplier 232 operates to multiply the gain-adjusted signal 230a given by $\sin(\omega_{CVH} t)$ with the oscillator output signal 228a which can be given by:

$$v_o = V_o \cos(\omega_{CVH} t - \theta_e) \qquad (2)$$

where $\omega_{CVH}$ is the frequency of the measured magnetic field signal 110a (as may be represented by clock signal 120c) and $\theta_e$ is the phase of the measured magnetic field signal 110a. The output of multiplier 232 is thus a product signal 232a as follows:

$$\tilde{v}_d = v_i * v_o = \sin(\omega_{CVH} t) * \cos(\omega_{CVH} t - \theta_e) \qquad (3)$$

Using the following identity:

$$\sin(A)\cos(B) = 0.5 \sin(A-B) + 0.5 \sin(A+B) \qquad (4)$$

the product signal 232a can be expressed as $$\tilde{v}_d = 0.5 \sin(\theta_e) + 0.5 \sin(2\omega_{CVH} t - \theta_e) \qquad (5)$$

By operation of the low pass filter 234 to remove the component at $2\omega_{CVH}$, the difference signal 220a can be expressed as:

$$v_d = 0.5 \sin(\theta_e) * 0.5 \theta_e \qquad (6)$$

since for small $\theta_e$, $\sin(\theta_e) = \theta_e$.

Thus, the difference signal 220a provided by the phase detector 220 is a value related to the difference (e.g., a multiple of the difference) between the phase of the oscillator output signal 228a and the phase of the measured magnetic field signal 110a. The PLL loop acts to drive this difference in phase to zero.

Various circuits and techniques are possible for implementing the low pass filter 234. As one example, the low pass filter 234 may be a fourth-order elliptic filter.

Referring also to FIG. 6A, an example AGC circuit 230 of a type suitable for use in the phase detector 220 of FIG. 6 is responsive to the measured magnetic field signal 110a and to the reference signal 230b and generates the gain-adjusted, unity gain signal 230a, as shown. In the illustrated embodiment, a multiplier 238 multiplies the measured magnetic field signal 10a by a feedback signal 250a. The feedback signal 250a is generated by taking the absolute value of the AGC output signal 230a with an absolute value element 240 and filtering the output 240a of the absolute value element with a low pass filter 242. A signal 244a indicative of a difference between the filter output signal 242a and the reference signal 230b is generated by a summation element 244. The reference signal 230b has a value selected to establish the desired amplitude of the unity gain signal 230a so that the signal 244a will represent the difference between the desired magnetic field signal amplitude and the actual measured magnetic field signal level. Further processing of the signal 244a may be performed by a Proportional-Integral (PI) controller 246, a delay element 248, and a gain limiting element 250 to generate the feedback signal 250a, as shown. The PI controller 246 may take various forms. As one example, a proportional path may contain a gain element $K_P$ 246f and an integral path may include a gain element $K_I$ 246b and an integrator formed by a summation element 246c and a delay element 246d, which paths are coupled to a summation element 246e, as shown.

Figure 7:
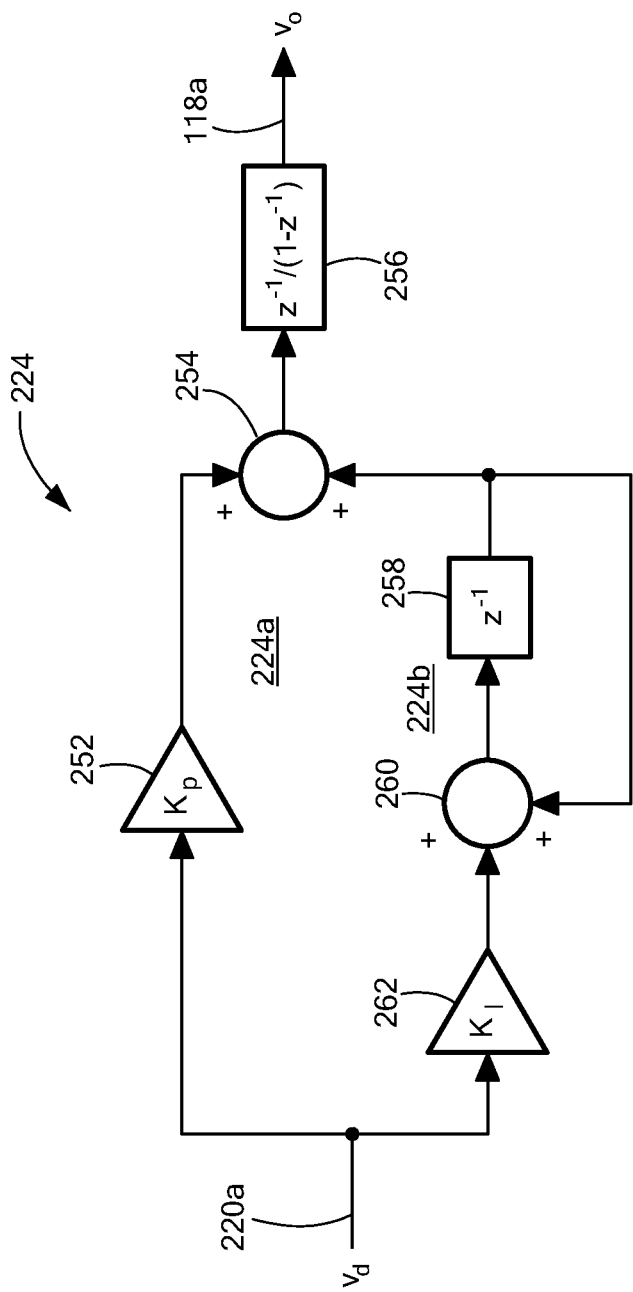
FIG. 7 is a block diagram of an example PI controller of FIG. 5.

An example PI controller 224 of a type suitable for use in the PLL 118 of FIG. 5 is shown in FIG. 7 to be responsive to the difference signal 220a (FIG. 5) and to generate the angle signal 118a. The illustrated PI controller 224 includes two parallel signal paths; a proportional signal path 224a and an integral signal path 224b. The proportional path 224a has a gain element 252 with a gain of $K_P$ and the integral path 224b has a discrete time integrator 258 there in the form of a delay element) and a gain element 262 with a gain of $K_I$. The integral path 224b further includes a summation element 260 configured as shown. Outputs of the proportional path 224a and the integral path 224b are summed by a summation element 254. An additional integrator 256 is coupled the output of the summation element 254 to generate the angle signal 118a. Use of the integrator 256 is desirable in the magnetic field sensor 100 since, as the velocity of rotation of the magnet 144 (FIG. 3) increases, a lag in the relationship between the measured magnetic field signal 110a and the magnetic field angle can increase and the integrator counteracts the effects of the increased lag.

The gain, $K_P$, of gain element 252 can be varied to adjust the bandwidth of the PLL 118. In one particular embodiment, the gain elements 252 262 are implemented as shift functions. With this arrangement, external control of the gain elements and thus, the PLL bandwidth is simplified to thereby simplify optimization of the response speed versus signal noise. It will be appreciated that various alternatives to the PI controller 224 shown in FIG. 7 may be used to still achieve loop stability and bandwidth optimization.

Referring again to FIG. 5, the angle signal 118a is coupled to the input to the oscillator 228. The clock signal 120c has a frequency of at least two times $\omega_{CVH}$ (i.e., two times the frequency of the measured signal 110a).

The phase increment accumulator 222 provides an output signal 222a to a summation element 226 that represents a $\omega_{CVH}t$, where the phase increment is based on the clock signal 120c. The output signal 226a of the summation element can thus be expressed as $\omega_{CVH}t-\theta_e$.

The sine lookup table 218 generates a value given by $V_o \cos(\omega_{CVH}t-\theta_e)$ in response to input signal 226a (see equation (2)). The value of gain Vo is selected as unity so that the inputs to the phase detector multiplier 232 (FIG. 6) both have unity gain. This arrangement ensures that the difference signal 220a (FIG. 6) is independent of signal amplitude differences and reflects only phase differences.

As noted above, the PLL 118 may be a digital sampled-data system operating on n samples of the measured magnetic field signal 110a per period T, where T is the time between phase updates of the angle signal 118a. Illustrative values of n are 16 or 32. Thus, as one example, in operation, the oscillator 228 responds to a 16 bit word 118a representing the magnetic field angle and generates a sine value 228a, also in the form of a 16 bit word for comparison by the phase detector 220 to 16 samples of the measured magnetic field signal 110a.

Figure 8:
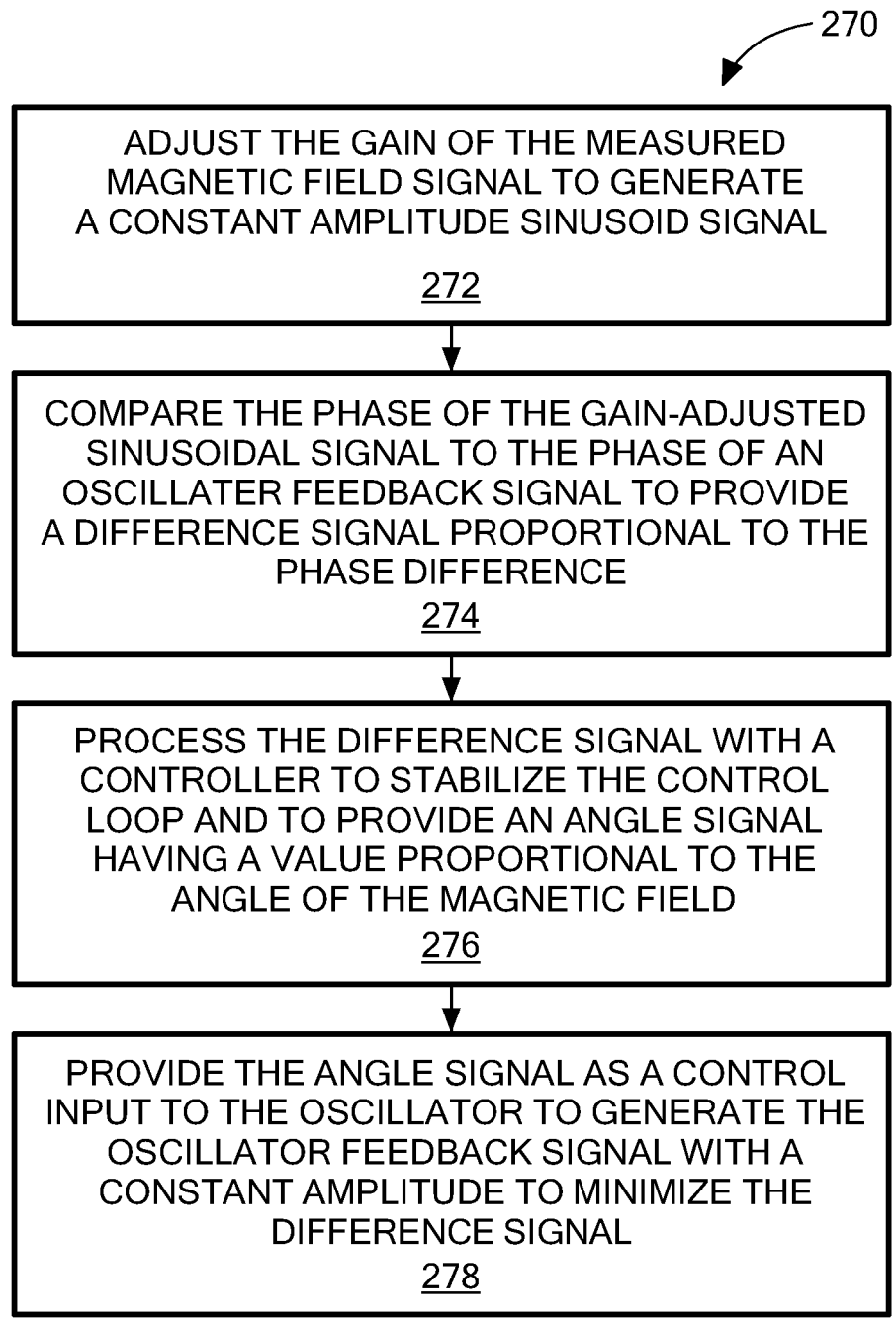
FIG. 8 is a flow diagram illustrating operation of the angle calculation module of FIG. 5.

Referring also to FIG. 8, a method of detecting an angle of a magnetic field in a magnetic field sensor is illustrated. The magnetic field sensor may be of the type described and shown above, to include a plurality of magnetic field sensing elements, each configured to generate a respective magnetic field sensing element output signal responsive to a magnetic field, wherein the magnetic field sensing element output signals form a measured magnetic field signal 110a (FIG. 3) having a phase indicative of an angle of the magnetic field. At block 272, the gain of the measured magnetic field signal may be adjusted to generate a contestant amplitude sinusoid signal, as may be implemented for example with the AGC circuit 230 of FIGS. 6 and 6A.

At block 274, the phase of the gain adjusted signal may be compared to phase of an oscillator feedback signal to provide a difference signal proportional to the phase difference. Such phase comparison may be achieved, for example, with the phase detector 220 shown in FIGS. 5 and 6 to generate difference signal 220a.

The difference signal 220a may be processed at block 276 with a controller, that may be the same as or similar to the PI controller of FIG. 7, to provide an angle signal that may be the same as or similar to the angle signal 118a having a value proportional to the angle of the magnetic field.

At block 278, the angle signal may be provided as a control input to the oscillator to generate the oscillator feedback signal with a constant amplitude and a phase to minimize the difference signal. The oscillator may be the same as or similar to the oscillator 228 in FIG. 5.

With the described circuits and methods, an update of the phase of the measured magnetic field signal 110a (and thus an update of the angle of the magnetic field) is generated throughout the period of the measured magnetic field signal, thereby providing a faster refresh rate and lower latency than otherwise possible. For a sampled-data system where there are n samples of the signal per period, T, the time between phase updates is Tin compared to at most T/2 for the zero crossing methods. Furthermore, the refresh rate achieved with the described circuits and techniques is constant (e.g., rather than changing as the speed of the magnetic field rotation changes) A fast and constant refresh rate may be particularly advantageous in applications such as motor controllers.

Reasons for selection of a different phase sequences among the vertical Hall elements of the CVH sensing element 102 are described more fully below in conjunction with FIG. 9.

Figure 9:
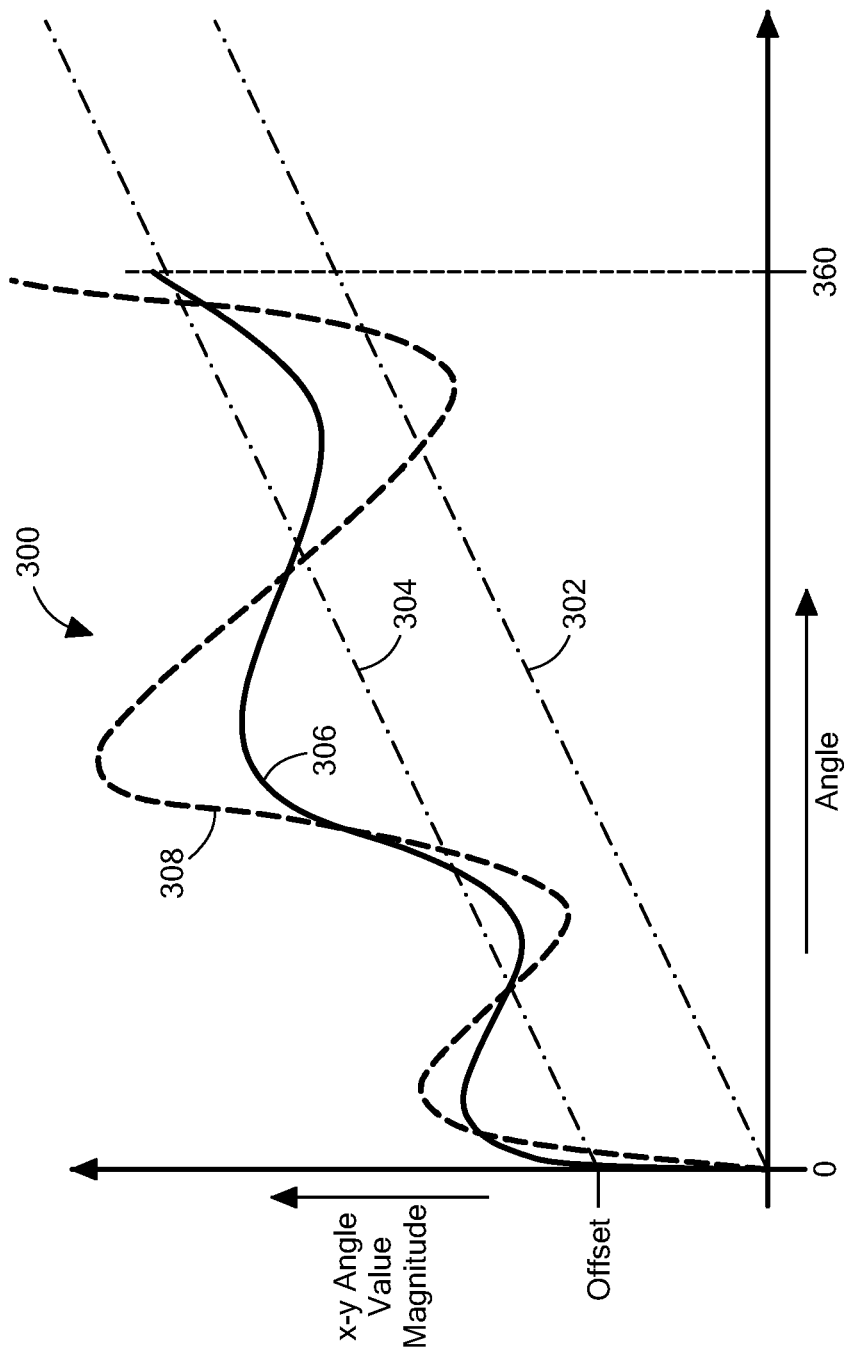
FIG. 9 is a graph showing ideal and non-ideal operation of the magnetic field sensor of FIG. 3.

Referring now to FIG. 9, a graph 300 has a horizontal axis with a scale in units of angular degrees and a vertical axis with a scale in units of value of an x-y angle value magnitude, for example, a magnitude of the uncorrected x-y angle value 118a of FIG. 3.

A line 302 is representative of an x-y angle value that has no angle error. When the x-y angle value has no angle error, the x-y angle value is perfectly linear with respect to actual angle, i.e., the x-y angle value is a perfect and true representation of the angle of the magnetic field generated by the magnet 144 of FIG. 3, and the line 302 passes through zero.

A line 304 is representative of an x-y angle value that has only an average or DC angle error, such that all angles represented by the x-y angle value are offset by a fixed number of degrees. The line 304 does not pass through zero.

A curve 306 is representative of an x-y angle value that has errors in representation of the true angle of the magnetic field generated by the magnet 144, average or DC errors and also an error that has a sinusoidal appearance.

A curve 308 is representative of an x-y angle value that has other errors in representation of the true angle of the magnetic field generated by the magnet 144.

A variety of circuit characteristics of the magnetic field sensor 100 contribute to the errors, i.e., to both the DC (or average) angle error represented by the curves 306, 308, and to the sinusoidal shapes of the curves 306, 308. One factor that contributes to the errors is switching noise generated by the sequence switches 104 and/or by the current spinning switches 105 of FIG. 3.

First, regarding the sequence switches 104, it will be understood that charge injection or switching spikes (together referred to as noise) generated by the sequence switches 104 are not necessarily exactly the same as each sequential vertical Hall element is selected in the CVH sensing element 102. When the noise generated by the sequence switches 104 is not the same as each vertical Hall element is selected and/or as a result of delay of the front end amplifier 108 and A/D converter 112, which delays can change with temperature, a DC (or average) angle error is generated and also a sinusoidal type error such as that represented by the curves 306, 308. The sinusoidal error characteristic can be, in part, a result of the noise generated by the sequence switches being repetitive for each cycle around the CVH sensing element 102, and thus, the noise will have an angle error frequency component at a frequency of the signal 52 of FIG. 2, and will add to the signal 52 (104a of FIG. 3). The angle error frequency component is essentially fixed in phase relative the signal 104a, and therefore, the addition of the angle error causes different phase shift errors in the summed signal depending on the phase of the signal 104a. Higher harmonics can also result from the noise.

Next, regarding the current spinning switches 105, it will be understood that charge injection or switching spikes (together referred to as noise) generated by the current spinning switches 105 are not necessarily exactly the same as each sequential vertical Hall element is selected in the CVH sensing element 102. When the noise generated by the current spinning switches 105 is not the same as each vertical Hall element is selected and/or as a result of delay of the front end amplifier 108 and A/D converter 112, which delays can change with temperature, a DC (or average) angle error is generated and also a sinusoidal type error such as that represented by the curves 306, 308. The sinusoidal error characteristic can, in part, result from the noise generated by the current spinning switches 105 being repetitive for each cycle around the CVH sensing element. However, by techniques described herein, phase sequences of the vertical Hall elements within the CVH sensing element 102 can be varied, and thus, the noise generated by the current spinning switches 105 need not be repetitive for each cycle around the CVH sensing element, and corresponding angle error is reduced.

Other circuit characteristics can also contribute to the angle errors, i.e., to both the DC (or average) angle error represented by the error curves 306, 308, and to the sinusoidal shapes of the error curves 306, 308. Namely, a speed with which the dual differential amplifier 108 of FIG. 3, and also other circuit elements of FIG. 3, settle to final values as the sequence switches 104 switch among the vertical Hall elements of the CVH sensing element 102, and also as the current spinning switches 105 switch among the various current spinning phases, contribute to the errors.

The above-described circuit characteristics, including, but not limited to, switching noise and lack of circuit elements settling to final values, tend to be influenced by (i.e., changed by) a variety factors including, but not limited to, temperature of the magnetic field sensor 100 of FIG. 3, rate of sequencing around the CVH sensing element 102, peak magnitude of the magnetic field experienced by the CVH sensing element 102 as the magnet 144 rotates, and selected current spinning sequence(s) among the various vertical Hall elements.

Differences between the curves 306, 308 can be attributed to changes in the same factors, namely, changes in the temperature, changes in or differences in peak amplitude of the magnetic field experienced by the CVH sensing element 102 as the magnet 144 rotates, changes in or differences in rates of sequencing around the CVH sensing element 102, and changes in or differences in selected current spinning sequence(s) among the various vertical Hall elements within the CVH sensing element 102. Among these factors, it will be understood that the changes in the temperature can occur at any time. The changes in the peak amplitude of the magnetic field can be influenced by positional changes, i.e., air gap changes, between the magnet 144 and the CVH sensing element 102 of FIG. 3. Furthermore, the impact of magnetic field strength variations on the angle error can vary with the application configuration. For example, so called "end of shaft" configurations (in which the magnetic field sensor is positioned along the axis of rotation of the rotating target) can experience less impact than so called "side shaft" configurations (in which the magnetic field sensor is positioned to the side of the axis of rotation).

The changes in the peak amplitude of the magnetic field can also be influenced by mechanical considerations, for example, wear of a bearing or a shaft upon which the magnet 144 rotates. However, the changes in sequencing rates and the changes in current spinning sequences can be fixed, and changed only for different applications of the magnetic field sensor 100.

In general, it has been determined that the dominant angle error frequency components occur at first and second harmonics of the frequency of the signal 52 (i.e., 104a or 105a). The curves 306, 308 are representative of angle error functions dominated by first and second harmonics of the frequency of the signal 52 (104a).

The angle error correction module 138 of FIG. 3 is configured to make changes to angle error corrections it applies according to at least the temperature and magnetic field contributions to the angle error represented by the curves 306, 308. In some embodiments, the angle error correction module 138 is also configured to make changes to the angle error corrections according to one or more of the other above-described factors that contribute to the difference between the curves 306, 308.

As described herein, angle errors represented by the curves 306, 308 and contained in the uncorrected angle value 118a (FIG. 3) are referred to as first angle errors, each influenced by the above factors. Other angle error curves (not shown) with lower peak to peak variation than the error curves 306, 308 are representative of second angle errors that are smaller than the first angle errors and that are contained in the corrected angle value 126a (FIG. 3).

Mathematically, the angle error represented by the curves 306, 308 can be represented as:

$$\hat{e}(\theta, T, B) = dc_T + \left(\frac{B_0}{B}\right) h1a_T \sin(\theta + h1p_T) + \left(\frac{B_0}{B}\right) h2a_T \sin(2\theta + h2p_T) \quad (7)$$

where:
$\hat{e}$=angle error value (signal 138a of FIG. 3);
T=temperature measured by temperature sensor 136;
$dc_T$=a DC angle error, which is a function of the temperature, T;
$h1a_T$=an amplitude of a first harmonic component of the error, which is a function of the temperature, T;
$h1p_T$=a phase of the first harmonic component, which is a function of the temperature, T;
$h2a_T$=an amplitude of a second harmonic component of the error, which is a function of the temperature, T;
$h2p_T$=a phase of the second harmonic component, which is a function of the temperature, T;
$B_0$=the nominal field strength, which is a function of the temperature, T;
B=the measured magnetic field strength; and
θ=the uncorrected magnetic field angle value (signal 118a of FIG. 3).

The nominal field strength ($B_0$) as a function of temperature (T) can be represented as follows:

$$B_0 = \left(\frac{B_{hot} - B_{room}}{T_{hot} - T_{room}}\right)(T - T_{room}) + B_{room} \quad (8)$$

where
$T_{room}$=room temperature (nominally 25° C.);
$T_{hot}$=a hot temperature (such as 125° C. or 150° C.);
$B_{room}$=magnetic field strength measured at room temperature; and
$B_{hot}$=magnetic field strength measured at the hot temperature.

While the error representation of equation (7) utilizes $B_0/B$ as the correction for the first harmonic amplitude and for the second harmonic error component, it will be appreciated that other correction factors such as the square root of $B_0/B$ may be used to model the angle error. Furthermore, other factors described above, other than temperature (T) and the peak amplitude of the magnetic field (B) experienced by the CVH sensing element 102 and generated by the magnet 144, which affect the angle error, are not taken into account in equation (7). Namely, the rate of sequencing around the CVH sensing element 102 is not taken into account and the current spinning phase sequence generated by the current spinning sequence selection module 119 is not taken into account in the above expression.

It is described below in conjunction with FIGS. 10-10C that the angle error correction module 138 of FIG. 3 can use programmable correction coefficients 140a stored in the EEPROM 140 to evaluate an expression the same as or similar to equation (7) in order to thereby generate the angle error value 138a. Thus, the EEPROM 140 can be configured to store a plurality of correction coefficients or values associated with the above equation (7). In some embodiments, the stored correction coefficients values can be programmed into the coefficient table EEPROM 140, for example, by way of the control signal 142 (FIG. 3).

As described above in conjunction with FIG. 3, the combining module 126 is operable to combine the angle error value 138a (i.e., the estimated error according to equation (1)), which is temperature and magnetic field strength dependent, with the uncorrected x-y angle value 118a to generate the corrected x-y angle value 126a that is more accurate and has a smaller (i.e., a second) error smaller than the first error of the uncorrected x-y angle value 118a. Thus, for each uncorrected angle value 118a, the estimated error, e, computed according to equation (7) can be digitally subtracted from (or added to) or otherwise mathematically combined with the sensed (i.e., measured) angle (i.e., the uncorrected x-y angle value 118a of FIG. 3).

Variation in current spinning phase sequences is described above. It should be apparent that both a proper selection of the variation of the current spinning phase sequences and the use of the angle error correction module 138 tend to reduce a magnitude of the angle error represented by the curves 306, 308. It should be appreciated that the two techniques can be used separately or together to achieve a reduction in angle error of the magnetic field sensor 100.

Figure 10:
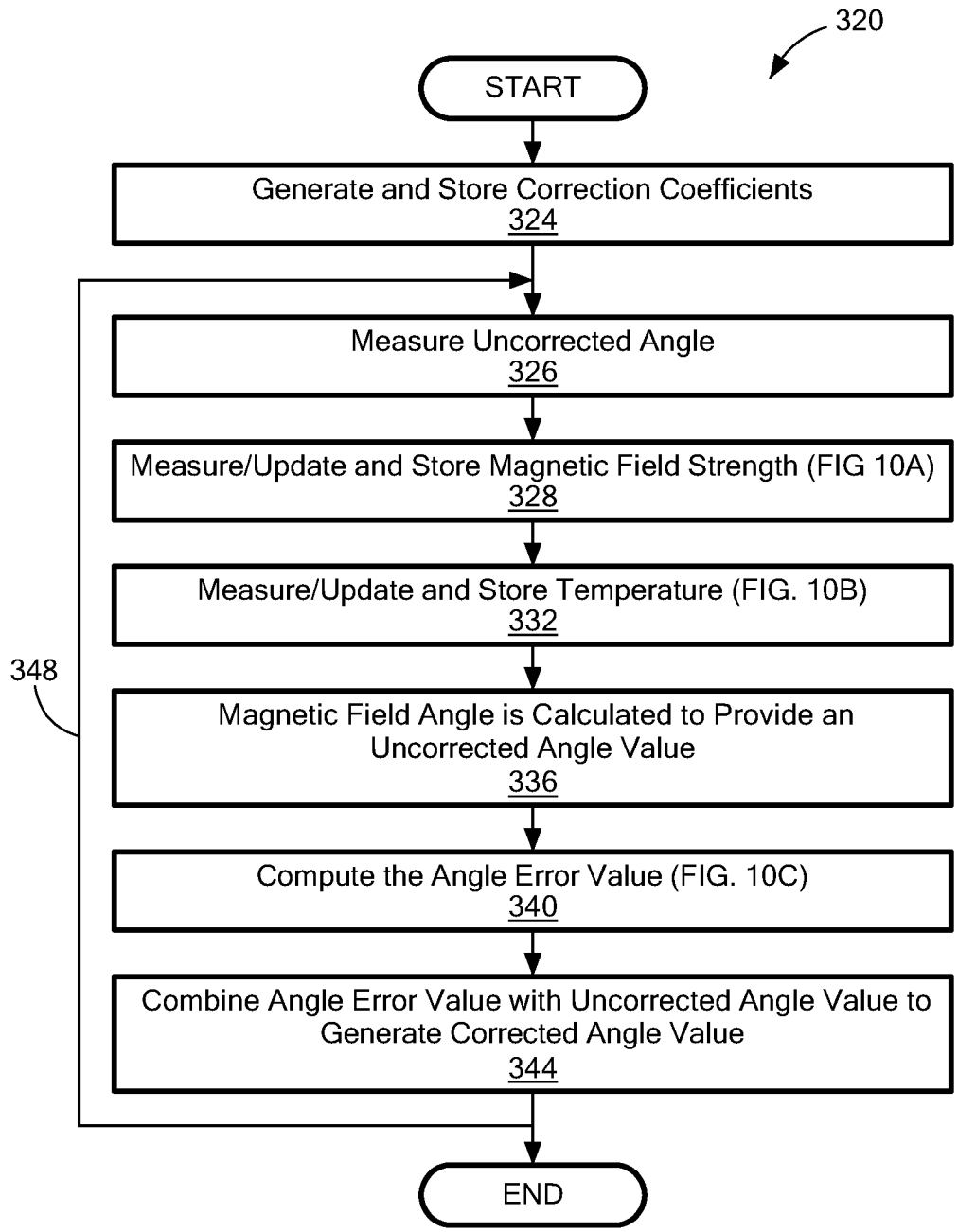
FIG. 10 is a flow diagram illustrating a method for correcting a measured magnetic field angle based on magnetic field strength and temperature.

Referring now to FIG. 10, a process 320 for generating a corrected magnetic field angle value 126a includes generating and storing correction coefficients 324. Generating and storing correction coefficients is generally performed during manufacture of the magnetic field sensor 100 and may include measuring the magnetic field angle at two or more temperatures, such as at room temperature ($T_0$) and at a "hot" temperature ($T_{hot}$) such as 125° C. or 150° C. In making such measurements, a known magnetic field angle and field strength are used.

Each of these angle measurements results in a measured angle value (θ) that includes error components that can be expressed in the form of equation (7) and thus, includes a DC component, a first harmonic amplitude component, a first harmonic phase component, a second harmonic amplitude component, and a second harmonic phase component. In one embodiment, the correction coefficient values that are stored in the EEPROM 140 are the values of these individual error components at room temperature (i.e., $dc_0$, $h1a_0$, $h1p_0$, $h2a_0$, $h2p_0$) along with respective corresponding scale factors (i.e., dc, h1a, h1p, h2a, h2p) based on temperature, as will be explained. Suffice it to say here that these correction coefficients are used by the correction module 138 to evaluate the error terms ($dc_T$, $h1a_T$, $h1p_T$, $h2a_T$, $h2p_T$) of equation (7). For simplicity, although the scale factor correction coefficients (i.e., dc, h1a, h1p, h2a, h2p) are generated and stored during manufacture (in block 324 of FIG. 10), these correction coefficients will be explained further below in connection with FIG. 10C. It will be appreciated that in other embodiments, the values stored in the EEPROM may be the individual error components at both room temperature and at the hot temperature.

Additional correction coefficients stored in EEPROM 140 can include a value ($T_0$) measured at the output of the temperature sensor 136 at room temperature, a temperature scale factor ($T_s$) used to compute the difference between the actual temperature (T) and room temperature, a magnetic field measurement at room temperature ($MFO_0$), a magnetic field offset scale factor (MFO) representing an offset between the magnetic field measurement at room temperature and at the hot temperature, a magnetic field measurement at a nominal field strength, such as 300G (MFS$_0$), and a magnetic field strength scale factor (MFS) representing a scale factor between the magnetic field measurement at the nominal field strength and a magnetic field measurement at a second field strength, such as 150G. The temperature scale factor (T$_s$) is computed by recording the sensor reading at room temperature and at a hot temperature, creating a scale factor to correct the measured temperature change to the known temperature change. Although the magnetic field offset scale factor correction coefficient (MFO) and magnetic field strength scale factor correction coefficient (MFS) are generated and stored during manufacture (in block 324 of FIG. 10), these correction coefficients will be explained further below in connection with FIG. 10C.

In operation, the magnetic field sensor 100 generates an uncorrected angle value 118$a$ (block 326) which triggers measurement of the magnetic field (block 328) and temperature (block 332). At block 326, the magnetic field strength is measured and provided to the angle error correction module 138 in the form of signal 110$a$ as will be explained further in connection with FIG. 10A. The ambient temperature is measured by temperature sensor 136 and provided to the angle error correction module 138 in the form of signal 136$a$ in block 332 as will be explained further in connection with FIG. 10B. In one embodiment, the temperature may be measured and updated on the order of every 4 milliseconds.

In block 336, the magnetic field angle θ is calculated by the angle calculation module 118 (FIG. 3) and the uncorrected angle value in the form of signal 118$a$ is provided to the sine lookup table 148. The sine lookup table 148 can provide first and second harmonic sine values 148$a$, 148$b$, respectively, to the angle error correction module 138 for use in evaluating equation (7) above. The magnetic field angle θ is derived from successive samples of the magnetic field strength measured in block 326. As one example, the magnetic field angle can be derived using the PLL 118 (FIG. 5) and related techniques described above. Alternatively, the magnetic field angle can be derived by analyzing samples for a zero amplitude crossing. The magnetic field strength may be derived in block 328 over a longer period of time, e.g. 64 samples. It will be appreciated that the particular order of the blocks and frequency of processing the blocks illustrated in the flow diagrams of FIGS. 10-10C can be varied.

In block 340, the angle error correction module 138 evaluates equation (7) as will be explained further in connection with FIG. 10C, following which the angle measurement and correction process can be repeated as illustrated by arrow 348.

Figure 10A:
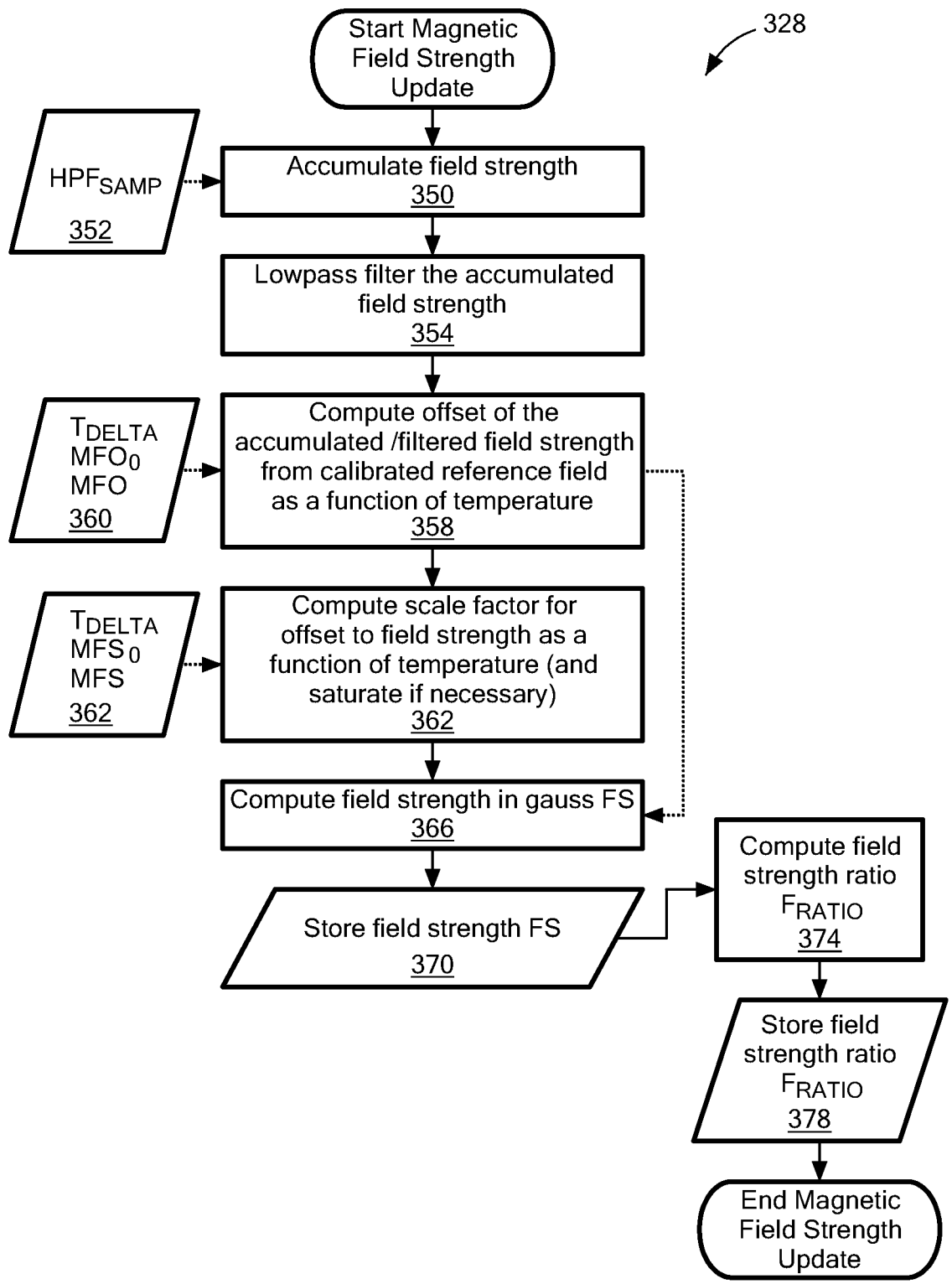
FIG. 10A is a flow diagram illustrating a method for measurement of the magnetic field strength in FIG. 10.
Figure 10B:
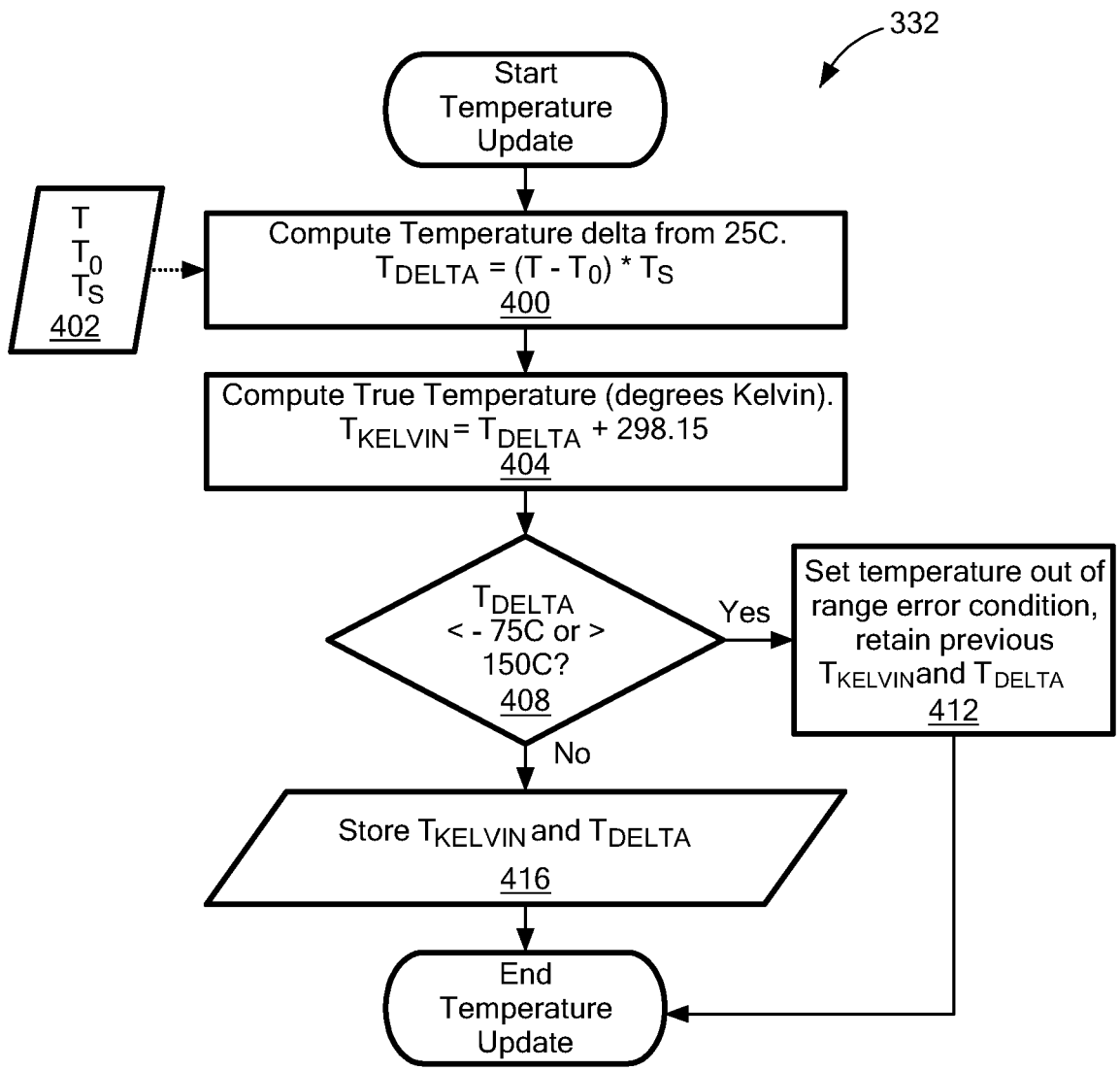
FIG. 10B is a flow diagram illustrating a method for measurement of the temperature in FIG. 10.
Figure 10C:
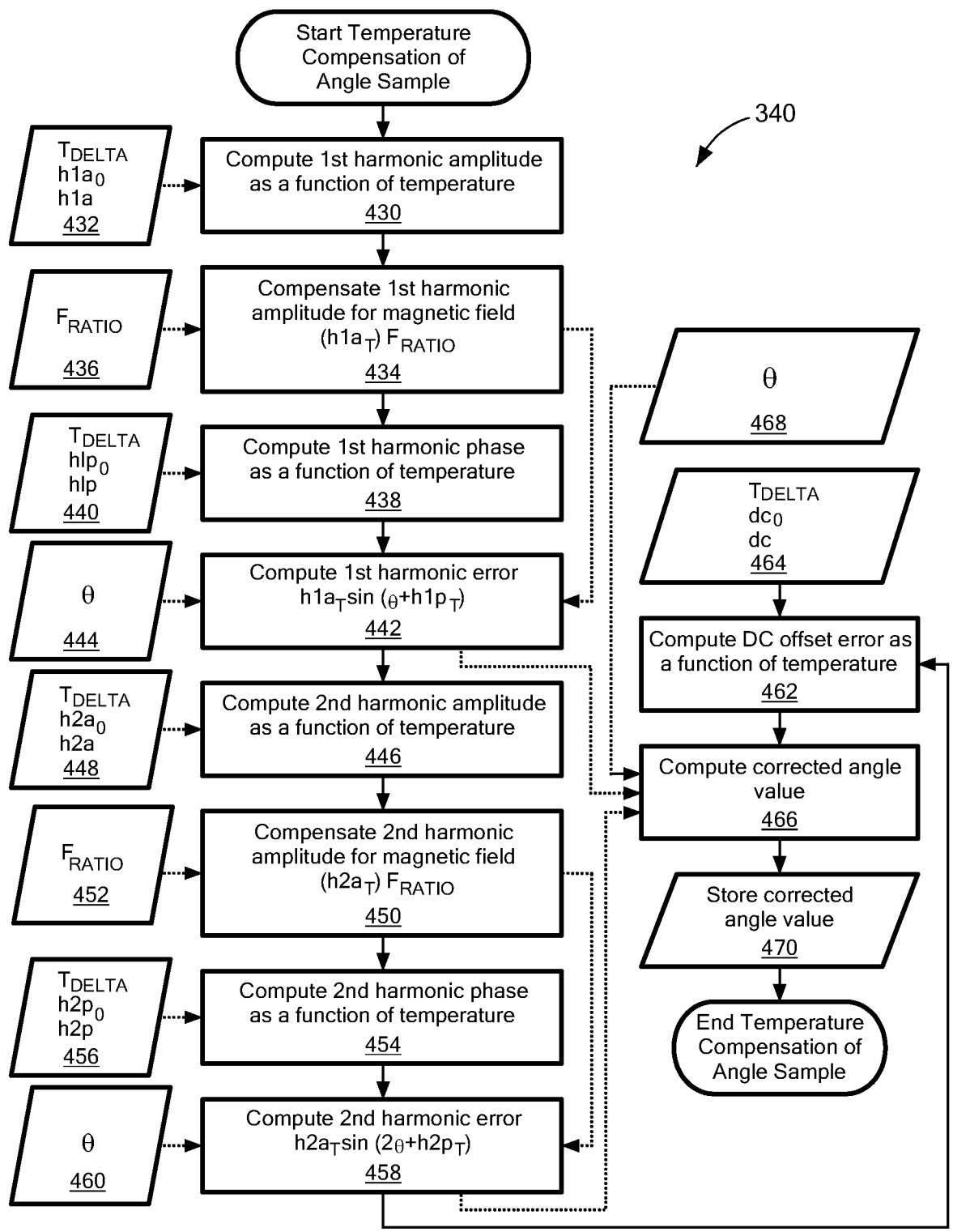
FIG. 10C is a flow diagram illustrating a method for correcting a measured magnetic field angle utilizing the methods of FIGS. 10A and 10B.

Referring also to FIGS. 10A, 10B, and 10C, illustrative processes for performing blocks 328, 332, and 340, respectively, are shown. In FIG. 10A, the magnetic field strength is updated by accumulating samples of the filtered signal (HP$_{SAMP}$) 110$a$ (FIG. 3) at block 350, following which the accumulated samples are filtered, such as by a lowpass filter 242 (FIG. 6A), at block 354. More particularly, the absolute value of the input signal 110$a$ is accumulated by absolute value element 240 (FIG. 6A) until N samples have been processed. In a typical application, there are 16 samples per period and the accumulation is performed over 8 periods, or N=16*8=128. This accumulation of the absolute value of samples is equivalent to a full-wave rectifier followed by a sinc lowpass decimation, as represented by block 354.

The process illustrated by blocks 358 . . . 378 can be used to generate a field strength ratio term (F$_{RATIO}$) that is then used to compute the angle error value in FIG. 10C. It will be appreciated that in the context of equation (8) above, the term B$_0$/B is equivalent to F$_{RATIO}$, albeit such terms computed in a different manner. In particular, the equation (8) term B$_0$/B uses a value B$_0$ that represents the nominal field strength adjusted for temperature; whereas the F$_{RATIO}$ term represents an adjustment to the measured field strength to account for variations due to temperature and field strength changes.

In block 358, an offset, MFO$_T$, between the accumulated and filtered magnetic field strength and nominal magnetic field strength (such as 300 Gauss) as a function of temperature and in response to data 360, including T$_{DELTA}$, MFO$_0$, and MFO, is computed as follows:

$$\text{MFO}_T = \text{FS}_{LP} - (\text{MFO}_0 + (T_{DELTA})(\text{MFO})) \quad (9)$$

where

FS$_{LP}$=the filtered field strength from block 354;
MFO$_0$=nominal magnetic field strength measured at room temperature and stored in EEPROM 140;
MFO=magnetic field offset scale factor representing the offset between the nominal magnetic field measurement at room temperature and at the hot temperature stored in EEPROM; and
T$_{DELTA}$=a scaled difference between the measured temperature (T) and the room temperature measurement (T$_0$) as explained further below in connection with FIG. 10B.

In block 362, a scale factor for the offset to field strength as a function of temperature, MFS$_T$, is computed in response to data 362 including T$_{DELTA}$, MFS$_0$, and MFS as follows:

$$\text{MFS}_T = \text{MFS}_0 + (T_{DELTA})(\text{MFS}) \quad (10)$$

Where

MFS$_0$=the measured scale factor for change in magnetic field strength at room temperature, calculated as the ratio of the measured difference in two applied fields to the ideal difference. Typical field strengths are 300G and 150G; and
MFS=the temperature scale factor for magnetic field strength change. MFS is calculated in a similar manner as MFS$_0$, only at two temperatures such as room and hot as follows:

$$MFS = \frac{MFS_{room} - MFS_{hot}}{T_{room} - T_{hot}} \quad (11)$$

In block 366, the magnetic field strength (FS) is computed in Gauss as illustrated by equation (6), following which the magnetic field strength is stored in block 370:

$$FS = 300 + (\text{MFO}_T / \text{MFS}_T) \quad (12)$$

A field strength ratio F$_{RATIO}$ is computed at block 374 as the ratio of the nominal field strength such as 300G to the magnetic field strength FS computed by equation (12), following which the field strength ratio F$_{RATIO}$ is stored in step 378.

Referring also to FIG. 10B, a process 332 for measuring and storing temperature is illustrated. In step 400, a temperature delta, T$_{DELTA}$, is computed in response to data 402; namely, the measured temperature value (T), the temperature value to corresponding to room temperature (T$_0$), and the temperature scale factor T$_S$ as shown. In step 404, the temperature in Kelvin, T$_{KELVIN}$, is computed as shown. If, in step 408, it is determined that the temperature delta, T$_{DELTA}$, is either less than −75° C. or greater than 150° C., then in step 416, an error condition is indicated and the previous values for T$_{KELVIN}$ and T$_{DELTA}$ are retained. Otherwise, the new temperature value in Kelvin, $T_{KELVIN}$, and temperature delta, $T_{DELTA}$, are stored in step 416, as shown.

Referring also to FIG. 10C, a process 340 for calculating the angle error value, ê, is illustrated. In block 430, the first harmonic amplitude as a function of temperature, $h1a_T$, is computed according to the following equation (13) in response to data 432; namely, $T_{DELTA}$, $h1a_0$, and h1a.

$$h1a_T = h1a(T_{DELTA}) + h1a_0 \qquad (13)$$

where $h1a_0$=first harmonic amplitude measured at room temperature and stored in EEPROM 140;

h1a=first harmonic amplitude scale factor, stored in EEPROM.

The first harmonic amplitude scale factors, h1a, can be computed as illustrated by equation (14):

$$h1a = \frac{h1a_{hot} - h1a_0}{T_{hot} - T_{room}} \qquad (14)$$

where $h1a_0$=the first harmonic amplitude at room temperature, as stored in EEPROM 140 in step 324; and $h1a_{hot}$=the first harmonic amplitude at the hot temperature.

It will be appreciated that the remaining harmonic amplitude and scale factors h1p, h2a, h2p (used as described below) can be computed in the same general manner as the first harmonic amplitude scale factor h1a, but with appropriate substitution of the corresponding harmonic amplitude and phase measurements.

The first harmonic amplitude is scaled by the magnetic field scale factor, or $F_{RATIO}$, as may be computed according to FIG. 10A (block 434).

In block 438, the first harmonic phase as a function of temperature, $h1p_T$, is computed according to the following equation (15) in response to data 440; namely, $T_{DELTA}$, $h1p_0$, and h1p.

$$h1p_T = h1p(T_{DELTA}) + h1p_0 \qquad (15)$$

where $h1p_0$=second harmonic phase measured at room temperature and stored in EEPROM 140; and h1p=second harmonic phase scale factor, stored in EEPROM and computed as explained above.

In block 442, the first harmonic error component of equation (7) is computed as shown, in response to data 444 including the sine term 148a based on the uncorrected angle value θ, the first harmonic amplitude $h1a_T$ computed at 434, and the first harmonic phase $h1p_T$ computed at 438.

In block 446, the second harmonic amplitude as a function of temperature, $h2a_T$, is computed according to the following equation (16) in response to data 448; namely, $T_{DELTA}$, $h2a_0$, and h2a.

$$h2a_T = h2a(T_{DELTA}) + h2a_0 \qquad (16)$$

where $h2a_0$=second harmonic amplitude measured at room temperature and stored in EEPROM 140; and h2a=second harmonic amplitude scale factor, stored in EEPROM and computed as explained above.

As shown at 450, the second harmonic amplitude is scaled by the magnetic field strength ratio $F_{RATIO}$, as may be computed according to FIG. 10A.

At block 454, the second harmonic phase as a function of temperature, $h2p_T$, is computed according to the following equation (17) in response to data 456; namely, $T_{DELTA}$, $h2p_0$, and h2p.

$$h2p_T = h2p(T_{DELTA}) + h2p_0 \qquad (17)$$

where $h2p_0$=second harmonic phase measured at room temperature and stored in EEPROM 140; and h2p=second harmonic phase scale factor, stored in EEPROM and computed as explained above.

At block 458, the second harmonic error component of equation (7) is computed as shown, in response to data 460 including the sine term 148b based on the uncorrected angle θ, the second harmonic amplitude $h2a_T$ computed at 450 and the second harmonic phase $h2p_T$ computed at 454.

At block 462, the average or DC angle error as a function of temperature, $dc_T$, is computed according to equation (18) in response to data 464 including $T_{DELTA}$, $dc_0$, and dc as follows:

$$dc_T = dc(T_{DELTA}) + dc_0 \qquad (18)$$

where $dc_0$=DC error component at room temperature, as stored in EEPROM 140 in step 324; and dc=a scale factor, stored in EEPROM and calculated during manufacture as follows:

$$dc = \frac{dc_{hot} - dc_0}{T_{hot} - T_0} \qquad (19)$$

where $dc_{hot}$=DC error component at the hot temperature.

In step 466, the angle error value ê (equation (7)) is computed by adding the error components including the dc error component computed in step 462, the first harmonic error component computed in step 442, and the second harmonic error component computed in step 458 and the corrected angle value 126a is computed by subtracting the angle error value ê from the uncorrected angle value θ. In step 470 the corrected angle value 126a is stored. It will be appreciated that while block 466 is shown in FIG. 10C as being part of the process 340 for computing the angle error value ê by the angle error correction module 138, this operation may alternatively be performed by combining module 126 external to the angle error correction module as illustrated in FIG. 3.

While correction coefficients representative of a value of the DC component of the angle error, amplitude and phase values of the first harmonic of the angle error, amplitude and phase values of the second harmonic of the angle error, and related scale factors are described, in other embodiments, fewer than, more than, or different correction coefficients can be stored and used. For example, correction coefficients representative of even higher harmonics can be stored and used, for example, by appropriate expansion of equation (7).

The angle error correction module 138 can include an analog-to-digital converter coupled to receive the temperature signal 136a from the temperature sensor 136 and configured to generate a converted signal, which is a digital signal representative of the temperature of the magnetic field sensor 100. In some embodiments, the angle error correction module 138 can optionally include a temperature change detection module coupled to receive the digital temperature signal and configured to identify if the digital temperature signal is representative of a change in temperature or representative of no change temperature. The temperature change detection module can be configured to generate a control signal also indicative of a change in temperature or indicative of no change in temperature.

In some embodiments, the angle error correction module 138 can include one or more of a correction versus current spinning sequence module or a correction versus sequence rate module. For example, in response to a clock signal 120*b* (FIG. 3), the correction versus current spinning sequence module is configured to identify a correction factor related to the selected sequence of current spinning phase sequence groups that can be applied to further improve the x-y angle error value 138*a* and/or to identify a correction factor related to the rate at which vertical Hall elements within the CVH sensing element 102 of FIG. 3 are sequenced, which correction factor can be applied to further improve the x-y angle error value 138*a*.

In some embodiments, a user can program the magnetic field sensor 100 of FIG. 3 to use a selected type of expression within the angle error correction module 138. Thus, in some embodiments, the magnetic field sensor 100 uses equation (7), and in other embodiments, the magnetic field sensor uses a different angle error expression.

Figure 11:
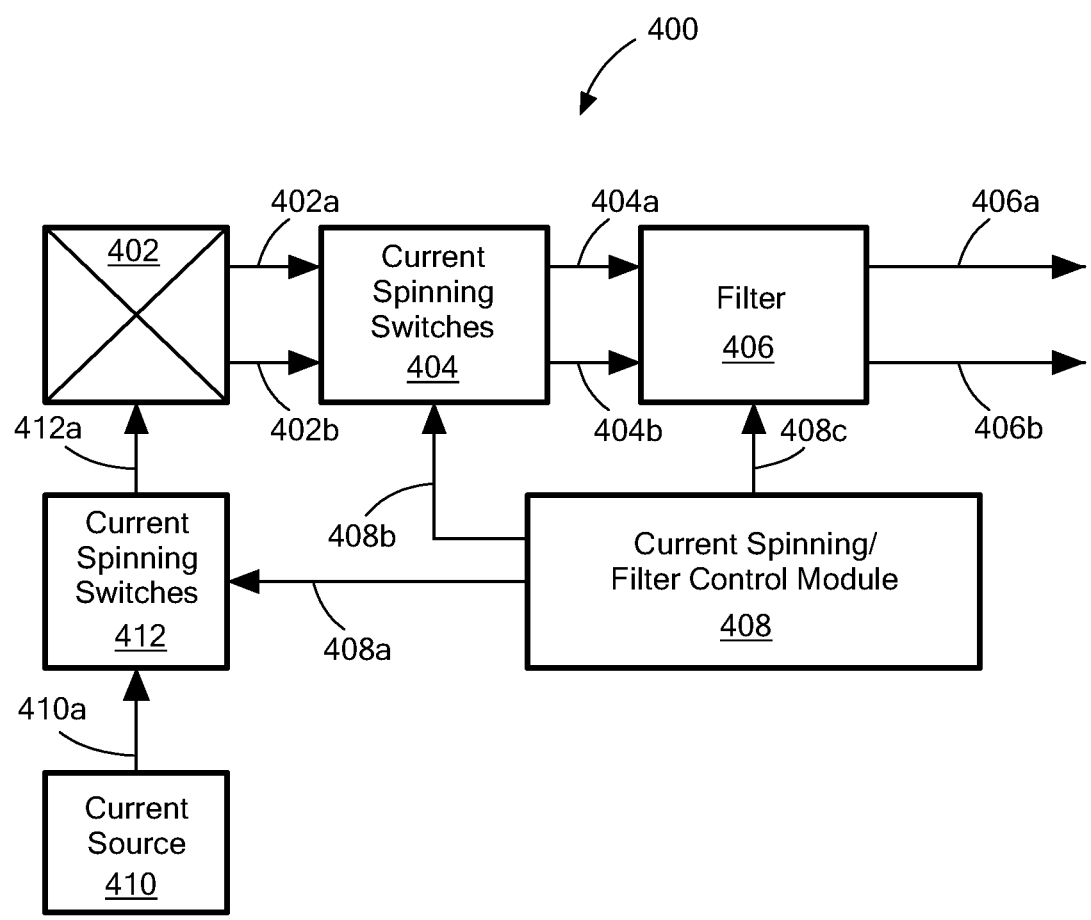
FIG. 11 is a block diagram of a magnetic field sensor that has but one planar Hall element, and that has a current spinning/filter control module to control current spinning phases.
Figure 12:
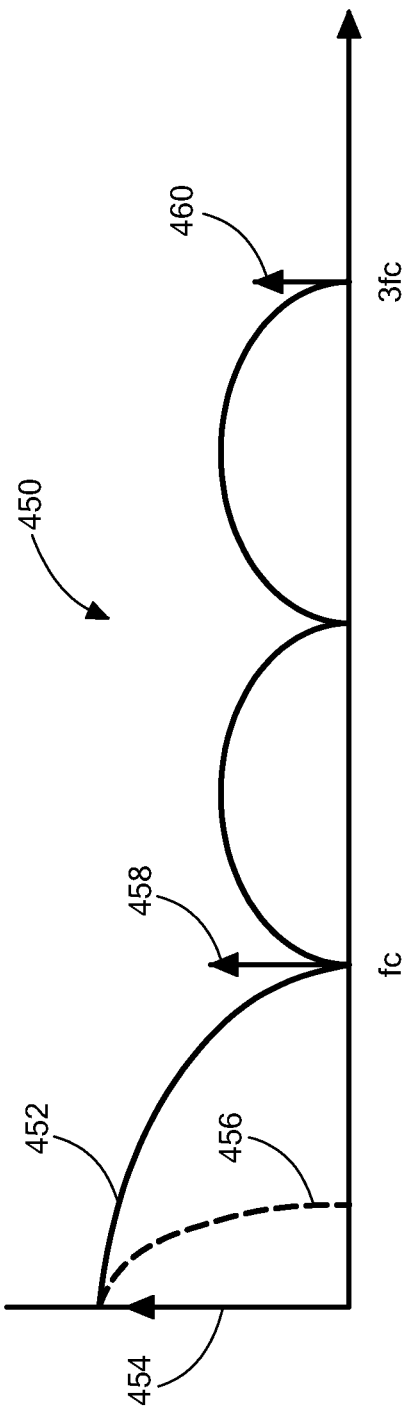
FIG. 12 is a graph showing a frequency domain of operation of the magnetic field sensor of FIG. 11, when operated with repeating current spinning phase sequences.
Figure 13:
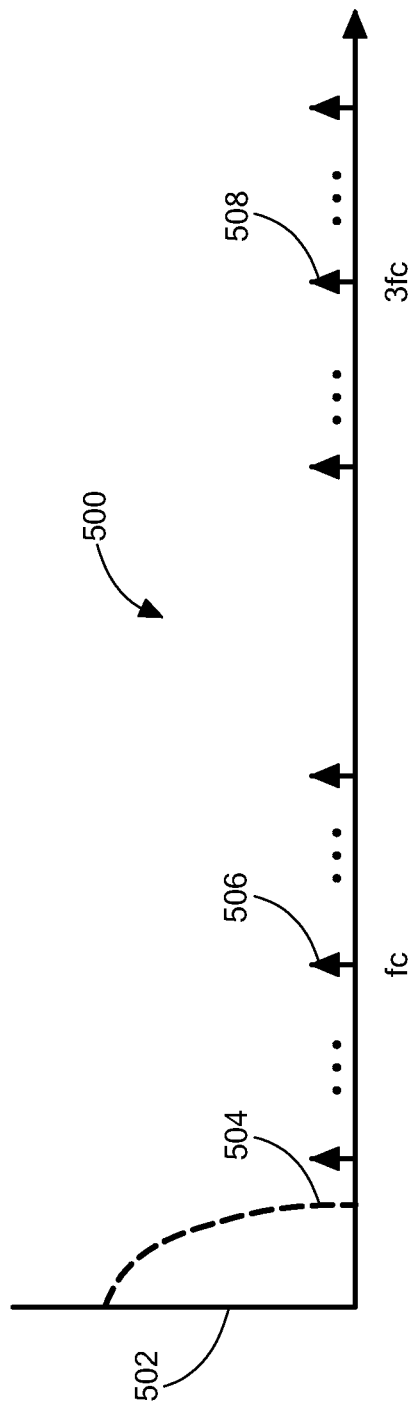
FIG. 13 is a graph showing a frequency domain of operation of the magnetic field sensor of FIG. 11 when operated with varying current spinning phase sequences.

Returning again to the subject of variations or changes of current spinning phase sequences first described above in conjunction with FIG. 3 with respect to a the CVH sensing element 102, FIGS. 11-13 show the advantages of similar current spinning phase sequence variations applied to a simple planar Hall Effect element.

Referring to FIG. 11, a simple magnetic field sensor 400 includes a planar Hall Effect element 402. The Hall element 402 is coupled to receive a current signal 412*a* at different selected ones of four contacts in accordance with a plurality of current spinning phases determined by current spinning switches 412. A current source 410 supplies a current signal 410*a* to the current spinning switches 412.

A differential output 402*a*, 402*b* of the Hall effect element 402 is coupled to current spinning switches 404, which select different ones of the four terminals as the output terminals as current spinning progresses through the plurality of phases.

Specific couplings for two or four phase current spinning of the four terminal planar Hall element are not shown herein but are well understood. Taking an example where the current spinning is done in four phases and labeling the phases with letters, a conventional arrangement would repeat the same phase sequence periodically, e.g., ABCD, where each sequence of phases occurs in a respective current spinning cycle having a cycle period. However, the magnetic field sensor 400 can include a current spinning and filter control module 408 coupled to the current spinning switches 404, 412, which can be configured to vary or change the sequence of phases from time to time or upon each cycle through a set of four phases. The variations can be fully random or pseudo-random. However, in other arrangements the variations can select between two or more current spinning phase sequences from time to time.

In one non-limiting example, current spinning phases can take on the following four sequences and then repeat: ABCD, BCDA, CDAB, DABC. In this particular example, only four current spinning phase sequences are used, each having four phases. However, it will be understood that four current spinning phases can result in twenty-four combinations of the four phases in twenty-four current spinning phase sequences. The twenty-four current spinning phase sequences can be randomly selected, pseudo-randomly selected, or periodically selected.

In a basic and non-limiting embodiment, there are only two current spinning phase sequences, e.g., ABCD and CDAB, and the current spinning phase sequence applied to the Hall element 402 can be changed from time to time between the two phase sequences. There can also be more than two phase sequences and the current spinning phase sequence applied the Hall element 402 can be changed from time to time between the more than two phase sequences.

The current spinning switches 404 are configured to provide a differential output signal 404*a*, 404*b*. A filter 406 is coupled to receive the differential signal from the current spinning switches 404 and is configured to provide a differential output signal 406*a*, 406*b*.

It will be understood that, in the frequency domain, a result of a particular type of current spinning, referred to herein as an offset current spinning, the differential signal 404*a*, 404*b* appearing at the current spinning switches has two frequency components. A baseband component is responsive to a magnetic field and remains at baseband. However, an offset signal component with the differential signal 404*a*, 404*b* is shifted to a higher frequency according to a frequency at which the current spinning sequences through the phases, i.e., a chopping frequency.

In operation, the filter 406 can remove the offset signal component of the differential signal 404*a*, 404*b*, leaving only the magnetically responsive signal component in the differential output signal 406*a*, 406*b*.

Referring now to FIG. 12, a graph 450 has a horizontal axis with a scale in units of frequency in arbitrary units and a vertical axis with a scale in amplitude in arbitrary units.

The graph 450 is representative of operation of a magnetic field sensor like the magnetic field sensor 400 of FIG. 11, but without any variation of the current spinning phase sequences applied to the Hall element 402. In other words, for example, the phase sequence ABCD repeats over and over without variation.

A spectral line 454 is representative of the magnetically responsive signal component of the differential signal 404*a*, 404*b* of FIG. 11. A spectral line 458 is representative of the offset signal component of the differential signal 404*a*, 404*b* of FIG. 11 after the current spinning operation of the current spinning switches 404, 412, but without variation of the current spinning phase sequences. A spectral line 460 is representative of a third harmonic of the offset signal component represented by the spectral line 456.

It will be understood that the spectral line 454 is representative of the magnetic field sensing element 402 being responsive to a DC magnetic field. However, the magnetic field sensing element 402 can be responsive to AC magnetic fields. Thus, a baseband bandwidth 456 is representative of a region in which the magnetic field sensing element 402 can provide signal information responsive to a magnetic field.

A transfer function 452 is representative of a transfer function of one of particular embodiment of the filter 406 of FIG. 11. In particular, the transfer function 452 is representative of a digital filter having transfer function notches. In some embodiments, it is advantageous to design the filter 406 and control the filter 406 with control signal 408*c* such that the notches appear at the same positions as the offset component spectral lines 458, 460. Thus, with such a filter, the differential output signal 406*a*, 406*b* will have content only within the baseband 456.

It will be recognized that use of a filter tends to slow down operation of the magnetic field sensor 400. Also, because the passband 456 must roll off below the frequency fc, the operational bandwidth or the magnetic field sensor 400 tends to be restricted.

Referring now to FIG. 13, a graph 500 has a horizontal axis with a scale in units of frequency in arbitrary units and a vertical axis with a scale in amplitude in arbitrary units.

The graph 500 is representative of operation of a magnetic field sensor like the magnetic field sensor 400, including variations or changes of the current spinning phase sequences. It will become apparent from discussion below that, using variation of the current spinning phase sequences, in some embodiments, the filter 406 of FIG. 11 can be eliminated.

A spectral line 502 is representative of the magnetically responsive signal component of the differential signal 404a, 404b. A spectral line 506 is representative of the offset signal component of the differential signal 404a, 404b after the varied current spinning operation of the current spinning switches 404, 412. A spectral line 508 is representative of a third harmonic of the offset signal component represented by the spectral line 506.

It will be understood that the spectral line 502 is representative of the magnetic field sensing element 402 being responsive to a DC magnetic field. However, the magnetic field sensing element 402 can be responsive to an AC magnetic field. Thus, a baseband bandwidth 504 is representative of a region in which the magnetic field sensing element 402 can provide signal information responsive to a magnetic field.

Other low amplitude spectral lines as shown may result from the variation of the current spinning phase sequences, depending upon the exact nature of the variation. There can be additional spectral lines that are not shown, but which are also at low amplitude.

It will be appreciated that the spectral lines 506, 508, and all other extraneous spectral lines have a much lower amplitude than the spectral lines 458, 460 of FIG. 12. In some applications, the various low amplitude spectral lines have a low enough amplitude that the filter 406 of FIG. 11 is not required in all. Having no filter at all results in a faster magnetic field sensing element and a wider bandwidth magnetic field sensing element. Accordingly, in some such embodiments, the baseband passband 504 can be substantially wider than that shown, and can be wider than the baseband passband 456 of FIG. 12. In some embodiments, the baseband passband 504 can extend well beyond the frequency 3fc.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a plurality of magnetic field sensing elements, each configured to generate a respective magnetic field sensing element output signal responsive to a magnetic field, wherein the magnetic field sensing element output signals form a measured magnetic field signal having a phase indicative of an angle of the magnetic field; and
a phase-locked loop having an input coupled to receive the measured magnetic field signal and having an output at which an angle signal is provided, the angle signal having a value proportional to the angle of the magnetic field, wherein the phase-locked loop is responsive to a clock signal having a frequency more than twice a frequency of the measured magnetic field signal, wherein the phase-locked loop comprises:
a phase detector having a first input responsive to the measured magnetic field signal and a second input responsive to a feedback signal having a respective phase, wherein the phase detector is configured to generate a difference signal indicative of a difference between the phase of the measured magnetic field signal and the phase of the feedback signal;
a proportional-integral controller coupled to the phase detector to receive the difference signal and configured to generate the angle signal at an output of the proportional-integral controller, wherein the output of the proportional-integral controller is the output of the phase-locked loop; and
an oscillator coupled directly to the output of the proportional-integral controller to receive the angle signal from the output of the phase-locked loop and configured to generate the feedback signal,
wherein the proportional-integral controller comprises:
a proportional signal path comprising a first gain element;
an integral signal path, parallel to the proportional signal path, comprising a second gain element, a delay element and a first summation element having a first input coupled to an output of the second gain element and a second input coupled to an output of the delay element;
a second summation element having a first input coupled to an output of the first gain element and a second input coupled to the output of the delay element; and
an integrator having an input coupled to an output of the second summation element and an output providing the angle signal, wherein one or both of the first and second gain elements are configured to perform a shift function.

2. The magnetic field sensor of claim 1, wherein the phase detector comprises:
an automatic gain control circuit coupled to receive the measured magnetic field signal and configured to provide a unity gain signal having a phase indicative of the angle of the magnetic field;
a multiplier responsive to the unity gain signal and to the feedback signal to provide a product signal; and
a low pass filter responsive to the product signal to provide the difference signal.

3. The magnetic field sensor of claim 2 wherein the low pass filter comprises one or more notches at one or more respective frequencies related to the frequency of the measured magnetic field signal.

4. The magnetic field sensor of claim 1, wherein the plurality of magnetic field sensing elements comprises a plurality of sets of vertical Hall Effect elements, each set arranged as a circular vertical Hall (CVH) element.

5. The magnetic field sensor of claim 1, further comprising a high pass filter responsive to the plurality of magnetic field sensing element output signals to generate the measured magnetic field signal.

6. The magnetic field sensor of claim 1, further comprising an angle error correction circuit responsive to the angle signal and to the measured magnetic field signal to generate a corrected angle value.

7. The magnetic field sensor of claim 1, wherein the measured magnetic field signal has a substantially sinusoidal shape.

8. The magnetic field sensor of claim 1, wherein the measured magnetic field signal has a substantially square-wave shape.

9. The magnetic field sensor of claim 1, wherein the magnetic field is a diagnostic magnetic field.

10. The magnetic field sensor of claim 1, wherein the angle signal is a sampled signal and wherein the angle signal is updated at a refresh rate that does not change as a speed of rotation of the magnetic field changes.

11. A method of detecting an angle of a magnetic field with a magnetic field sensor comprising a plurality of magnetic field sensing elements, each configured to generate a respective magnetic field sensing element output signal responsive to the magnetic field, wherein the magnetic field sensing element output signals form a measured magnetic field signal having a phase indicative of an angle of the magnetic field, the method comprising:
adjusting a gain of the measured magnetic field signal to generate a gain-adjusted signal;
comparing a phase of the gain-adjusted signal to a phase of a feedback signal to provide a difference signal indicative of a phase difference between the phase of the measured magnetic field signal and the phase of the feedback signal to minimize the difference signal by:
multiplying the gain-adjusted signal and the feedback signal to provide a product signal; and
filtering the product signal to provide the difference signal;
processing the difference signal with a proportional-integral controller to provide an angle signal having a value proportional to the angle of the magnetic field; and
using the angle signal to generate the feedback signal by providing an oscillator having a first input responsive to the angle signal and a second input responsive to a clock signal having a frequency more than twice a frequency of the measured magnetic field signal,
wherein the magnetic field sensor further comprises:
a phase-locked loop having an input coupled to receive the measured magnetic field signal and having an output at which the angle signal is provided, the angle signal having a value proportional to the angle of the magnetic field, wherein the phase-locked loop is responsive to the clock signal, wherein the phase-locked loop comprises:
a phase detector having a first input responsive to the measured magnetic field signal and a second input responsive to the feedback signal, wherein the phase detector is configured to generate the difference signal indicative of the phase difference between the phase of the measured magnetic field signal and the phase of the feedback signal, wherein the phase detector is further configured to perform the adjusting of the gain of the measured magnetic field signal to generate the gain-adjusted signal and the comparing the phase of the gain-adjusted signal to the phase of a feedback signal to provide the difference signal indicative of the phase difference between the phase of the measured magnetic field signal and the phase of the feedback signal to minimize the difference signal;
the proportional-integral controller coupled to the phase detector to receive the difference signal and configured to generate the angle signal at an output of the proportional-integral controller, wherein the output of the proportional-integral controller is the output of the phase-locked loop, wherein the proportional-integral controller comprises:
a proportional signal path comprising a first gain element;
an integral signal path, parallel to the proportional signal path, comprising a second gain element, a delay element and a first summation element having a first input coupled to an output of the second gain element and a second input coupled to an output of the delay element;
a second summation element having a first input coupled to an output of the first gain element and a second input coupled to the output of the delay element; and
an integrator having an input coupled to an output of the second summation element and an output providing the angle signal, wherein one or both of the first and second gain elements are configured to perform a shift function; and
the oscillator coupled directly to the output of the proportional-integral controller to receive the angle signal from the output of the phase-locked loop and configured to generate the feedback signal.

12. The method of claim 11, the phase detector further comprising a low pass filter configured to perform the filtering of the product signal,
wherein the low pass filter has a notch at a frequency related to the frequency of the measured magnetic field signal.

13. The method of claim 11, wherein the plurality of magnetic field sensing elements comprises a respective plurality of vertical Hall Effect elements arranged as a circular vertical Hall (CVH) element.

14. The method of claim 11, further comprising filtering the plurality of magnetic field sensing element output signals with a high pass filter to generate the measured magnetic field signal.

15. The method of claim 11, wherein the measured magnetic field signal is a substantially sinusoidal signal.

16. The method of claim 11, wherein the measured magnetic field signal is a substantially square-wave signal.

17. The method of claim 11, wherein the magnetic field is a diagnostic magnetic field.

18. The method of claim 11, wherein processing the difference signal with the proportional-integral controller to provide the angle signal comprises processing the difference signal to provide the angle signal at a substantially constant rate.

19. A magnetic field sensor, comprising:
a plurality of magnetic field sensing elements, each configured to generate a respective magnetic field sensing element output signal responsive to a magnetic field, wherein the magnetic field sensing element output signals form a measured magnetic field signal having a phase indicative of an angle of the magnetic field; and
a phase-locked loop having an input coupled to receive the measured magnetic field signal and having an output at which an angle signal is provided, the angle signal having a value representing the angle of the magnetic field, wherein the angle signal is a sampled signal and wherein the angle signal is updated at a refresh rate that does not change as a speed of rotation of the magnetic field changes, wherein the phase-locked loop is responsive to a clock signal having a frequency more than twice a frequency of the measured magnetic field signal, wherein the phase-locked loop comprises:
  a phase detector having a first input responsive to the measured magnetic field signal and a second input responsive to a feedback signal having a respective phase, wherein the phase detector is configured to generate a difference signal indicative of a difference between the phase of the measured magnetic field signal and the phase of the feedback signal;
  an oscillator coupled to the output of the phase-locked loop to receive the angle signal from the output of the phase-locked loop and configured to generate the feedback signal, wherein the oscillator comprises:
    a phase increment accumulator responsive to the clock signal to generate a phase accumulated signal;
    a first summation element responsive to the phase accumulated signal and to the angle signal to generate a summed signal; and
    a look-up table configured to provide a sine value in response to the summed signal; and
  a proportional-integral controller coupled to receive the difference signal and configured to provide the angle signal as the output of the phase-locked loop to the oscillator,
wherein the proportional-integral controller comprises:
  a proportional signal path comprising a first gain element;
  an integral signal path, parallel to the proportional signal path, comprising a second gain element, a delay element and a second summation element having a first input coupled to an output of the second gain element and a second input coupled to an output of the delay element;
  a third summation element having a first input coupled to an output of the first gain element and a second input coupled to the output of the delay element; and
  an integrator having an input coupled to an output of the third summation element and an output providing the angle signal,
wherein one or both of the first and second gain elements are configured to perform a shift function.

20. The magnetic field sensor of claim 19, wherein the phase detector comprises:
  an automatic gain control circuit coupled to receive the measured magnetic field signal and configured to provide a unity gain signal having a phase indicative of the angle of the magnetic field;
  a multiplier responsive to the unity gain signal and to the feedback signal to provide a product signal; and
  a low pass filter responsive to the product signal to provide the difference signal.

21. The magnetic field sensor of claim 20 wherein the low pass filter comprises one or more notches at one or more respective frequencies related to the frequency of the measured magnetic field signal.

22. The magnetic field sensor of claim 19, wherein each of the plurality of magnetic field sensing elements comprises a respective plurality of vertical Hall Effect elements arranged as a circular vertical Hall (CVH) element.

23. The magnetic field sensor of claim 19, further comprising a high pass filter responsive to the plurality of magnetic field sensing element output signals to generate the measured magnetic field signal.

24. The magnetic field sensor of claim 19, further comprising an angle error correction circuit responsive to the angle signal and to the measured magnetic field signal to generate a corrected angle value.

25. The magnetic field sensor of claim 19, wherein the measured magnetic field signal has a substantially sinusoidal shape.

26. The magnetic field sensor of claim 19, wherein the measured magnetic field signal has a substantially square-wave shape.

27. The magnetic field sensor of claim 19, wherein the magnetic field is a diagnostic magnetic field.

28. The magnetic field sensor of claim 19, further comprising:
  an angle error correction circuit configured to receive the angle signal and to provide an angle error signal; and
  a combining circuit configured to combine the angle signal and the angle error signal to form a corrected angle signal.

29. A magnetic field sensor, comprising:
  a plurality of magnetic field sensing elements, each configured to generate a respective magnetic field sensing element output signal responsive to a magnetic field;
  sequence switches configured to receive the magnetic field sensing output signals;
  current spinning switches to receive the magnetic field sensing output signals from the sequence switches;
  an amplifier to receive the magnetic field sensing output signals from the current spinning switches and to provide an amplified signal;
  an analog-to-digital converter configured to receive the amplified signal from the amplifier and to provide a digital signal;
  a high pass filter configured to receive the digital signal and to provide a filtered signal, wherein the filtered signal forms a measured magnetic field signal having a phase indicative of an angle of the magnetic field;
  a phase-locked loop having an input coupled to receive the measured magnetic field signal and having an output at which an angle signal is provided, the angle signal having a value representing the angle of the magnetic field, wherein the angle signal is a sampled signal and wherein the angle signal is updated at a refresh rate that does not change as a speed of rotation of the magnetic field changes, wherein the phase-locked loop is responsive to a clock signal having a frequency more than twice a frequency of the measured magnetic field signal, wherein the phase-locked loop comprises:
    a phase detector having a first input responsive to the measured magnetic field signal and a second input responsive to a feedback signal having a respective phase, wherein the phase detector is configured to generate a difference signal indicative of a difference between the phase of the measured magnetic field signal and the phase of the feedback signal;
    an oscillator coupled to the output of the phase-locked loop to receive the angle signal from the output of the phase-locked loop and configured to generate the feedback signal; and
    a proportional-integral controller coupled to receive the difference signal and configured to provide the angle signal as the output of the phase-locked loop to the oscillator;

an angle error correction circuit configured to receive the angle signal and to provide an angle error signal; and a combining circuit configured to combine the angle signal and the angle error signal to form a corrected angle signal, wherein the proportional-integral controller comprises:

a proportional signal path comprising a first gain element;

an integral signal path, parallel to the proportional signal path, comprising a second gain element, a delay element and a second summation element having a first input coupled to an output of the second gain element and a second input coupled to an output of the delay element;

a third summation element having a first input coupled to an output of the first gain element and a second input coupled to the output of the delay element; and an integrator having an input coupled to an output of the third summation element and an output providing the angle signal, wherein one or both of the first and second gain elements are configured to perform a shift function.

30. The magnetic field sensor of claim 29, wherein the phase detector comprises:

an automatic gain control circuit coupled to receive the measured magnetic field signal and configured to provide a unity gain signal having a phase indicative of the angle of the magnetic field;

a multiplier responsive to the unity gain signal and to the feedback signal to provide a product signal; and a low pass filter responsive to the product signal to provide the difference signal.

31. The magnetic field sensor of claim 30, wherein the low pass filter comprises one or more notches at one or more respective frequencies related to the frequency of the measured magnetic field signal.

32. The magnetic field sensor of claim 29, wherein the plurality of magnetic field sensing elements comprises a plurality of sets of vertical Hall Effect elements, each set arranged as a circular vertical Hall (CVH) element.

33. The magnetic field sensor of claim 29, further comprising a high pass filter responsive to the plurality of magnetic field sensing element output signals to generate the measured magnetic field signal.

34. The magnetic field sensor of claim 29, further comprising an angle error correction circuit responsive to the angle signal and to the measured magnetic field signal to generate a corrected angle value.

35. The magnetic field sensor of claim 29, wherein the measured magnetic field signal has a substantially sinusoidal shape.

* * * * *

UNITED STATES PATENT AND TRADEMARK OFFICE
CERTIFICATE OF CORRECTION

PATENT NO. : 11,163,022 B2
APPLICATION NO. : 14/737739
DATED : November 2, 2021
INVENTOR(S) : Steven Daubert It is certified that error appears in the above-identified patent and that said Letters Patent is hereby corrected as shown below:

In the Specification

Column 1, Line 30 delete "to magnetic" and replace with --to a magnetic--.

Column 1, Line 35 delete "to magnetic" and replace with --to a magnetic--.

Column 1, Lines 57-58 delete "of magnetic" and replace with --of a magnetic--.

Column 3, Line 8 delete "configure" and replace with --configured--.

Column 6, Line 56 delete "magnet 14" and replace with --circular magnet 14--.

Column 7, Line 6 delete "in a U.S." and replace with --in U.S.--.

Column 7, Line 29 delete "CVH taken" and replace with --CVH sensing element 12 taken--.

Column 8, Line 30 delete "signal 52)" and replace with --signal)--.

Column 11, Line 7 delete "a Hall" and replace with --Hall--.

Column 11, Line 36 delete "Hal" and replace with --Hall--.

Column 14, Line 5 delete "measured signal $110a$." and replace with --measured magnetic field signal $110a$.--.

Column 15, Line 7 delete "$10a$." and replace with --$110a$.--.

Column 15, Line 35 delete "there in the form" and replace with --(in the form--.

Column 15, Line 41 delete "coupled the" and replace with --coupled to the--.

Signed and Sealed this
Sixth Day of June, 2023

Katherine Kelly Vidal
*Director of the United States Patent and Trademark Office*

CERTIFICATE OF CORRECTION (continued)
U.S. Pat. No. 11,163,022 B2

Column 15, Line 50 delete "252 262" and replace with --252, 262--.

Column 15, Line 58 delete "to the oscillator" and replace with --of the oscillator--.

Column 15, Line 60 delete "measured signal 110*a*)." and replace with --measured magnetic field signal 110*a*).--.

Column 16, Line 11 delete "16 bit word 118a" and replace with --16-bit word angle signal 118a--.

Column 16, Line 52 delete "Tin" and replace with --T/n--.

Column 16, Line 59 delete "of a" and replace with --of--.

Column 18, Line 17 delete "variety factors" and replace with --variety of factors--.

Column 20, Line 16 delete "error, e," and replace with --error, ê,--.

Column 21, Line 66 delete "358...378" and replace with --358-378--.

Column 22, Lines 3-4 delete "terms computed" and replace with --terms are computed--.

Column 22, Line 54 delete "FS computed" and replace with --FS is computed--.

Column 22, Line 61 delete "value to corresponding" and replace with --value corresponding--.

Column 26, Line 9 delete "applied the" and replace with --applied to the--.

Column 26, Lines 25-26 delete "sequences through" and replace with --sequences move through--.

Column 27, Line 6 delete "in amplitude" and replace with --in units of amplitude--.

Column 27, Line 55 delete "that that" and replace with --that the--.